(12) United States Patent
Kasai et al.

(10) Patent No.: US 10,249,377 B2
(45) Date of Patent: Apr. 2, 2019

(54) SEMICONDUCTOR MEMORY DEVICE

(71) Applicant: TOSHIBA MEMORY CORPORATION, Minato-ku, Tokyo (JP)

(72) Inventors: Hayao Kasai, Nishitokyo Tokyo (JP); Osamu Nagao, Yokohama Kanagawa (JP); Mitsuaki Honma, Fujisawa Kanagawa (JP); Yoshikazu Harada, Kawasaki Kanagawa (JP); Akio Sugahara, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/700,864

(22) Filed: Sep. 11, 2017

(65) Prior Publication Data

US 2018/0247695 A1     Aug. 30, 2018

(30) Foreign Application Priority Data

Feb. 27, 2017   (JP) .................................. 2017-034599

(51) Int. Cl.
  *G11C 16/34*    (2006.01)
  *G11C 16/26*    (2006.01)
  *G11C 16/04*    (2006.01)
  *G11C 16/08*    (2006.01)
  *G11C 16/10*    (2006.01)
  (Continued)

(52) U.S. Cl.
  CPC ............ *G11C 16/3459* (2013.01); *G11C 7/22* (2013.01); *G11C 11/5628* (2013.01); *G11C 16/0483* (2013.01); *G11C 16/08* (2013.01); *G11C 16/10* (2013.01); *G11C 16/24* (2013.01); *G11C 16/26* (2013.01); *G11C 16/30* (2013.01); *G11C 16/32* (2013.01)

(58) Field of Classification Search
  CPC ... G11C 16/3459; G11C 7/22; G11C 11/5628; G11C 16/0483; G11C 16/08; G11C 16/10; G11C 16/24; G11C 16/26; G11C 16/30; G11C 16/32
  USPC .................................................... 365/185.22
  See application file for complete search history.

(56) References Cited

U.S. PATENT DOCUMENTS 7,800,945 B2    9/2010  Cernea
8,559,236 B2   10/2013  Nakai et al.
(Continued)

FOREIGN PATENT DOCUMENTS

JP    2009129479 A    6/2009
JP    2013020682 A    1/2013
JP    2014186787 A   10/2014

*Primary Examiner* — Ly D Pham
(74) *Attorney, Agent, or Firm* — Holtz, Holtz & Volek PC

(57) ABSTRACT

According to one embodiment, a semiconductor memory device includes a memory cell, a bit line, a sense amplifier, a word line, and a row decoder. A write operation repeats a program loop including a program operation, first and second verify operations. The row decoder applies a first read voltage to the word line in the first and second verify operations. When the write operation is not suspended, the sense amplifier senses a voltage of the bit line for a first sense period in the first verify operation. When the write operation is suspended, the sense amplifier senses the voltage of the bit line for a second sense period shorter than the first sense period in the initial first verify operation after a resumption of the write operation.

10 Claims, 30 Drawing Sheets

(51) Int. Cl.
*G11C 16/30* (2006.01)
*G11C 7/22* (2006.01)
*G11C 11/56* (2006.01)
*G11C 16/24* (2006.01)
*G11C 16/32* (2006.01)

(56) References Cited

U.S. PATENT DOCUMENTS

| | | |
|---|---|---|
| 9,406,395 B1 | 8/2016 | Kodama et al. |
| 2004/0264257 A1* | 12/2004 | Hamaguchi ........ G11C 16/0408 365/210.1 |
| 2007/0171721 A1* | 7/2007 | Shibata .............. G11C 11/5628 365/185.17 |
| 2008/0055971 A1* | 3/2008 | Kim .................. G11C 11/5678 365/163 |
| 2009/0129157 A1 | 5/2009 | Honda et al. |
| 2009/0267128 A1 | 10/2009 | Maejima |
| 2009/0268522 A1 | 10/2009 | Maejima |
| 2010/0207195 A1 | 8/2010 | Fukuzumi et al. |
| 2010/0214838 A1 | 8/2010 | Hishida et al. |
| 2011/0284946 A1 | 11/2011 | Kiyotoshi |
| 2012/0069663 A1 | 3/2012 | Itagaki et al. |
| 2012/0307557 A1 | 12/2012 | Itagaki |
| 2013/0016577 A1 | 1/2013 | Nagadomi |
| 2016/0012891 A1* | 1/2016 | Intrater ............. G11C 13/0069 365/148 |
| 2016/0012902 A1 | 1/2016 | Harada et al. |
| 2017/0271017 A1* | 9/2017 | Kanamori ......... G11C 16/0483 |

* cited by examiner

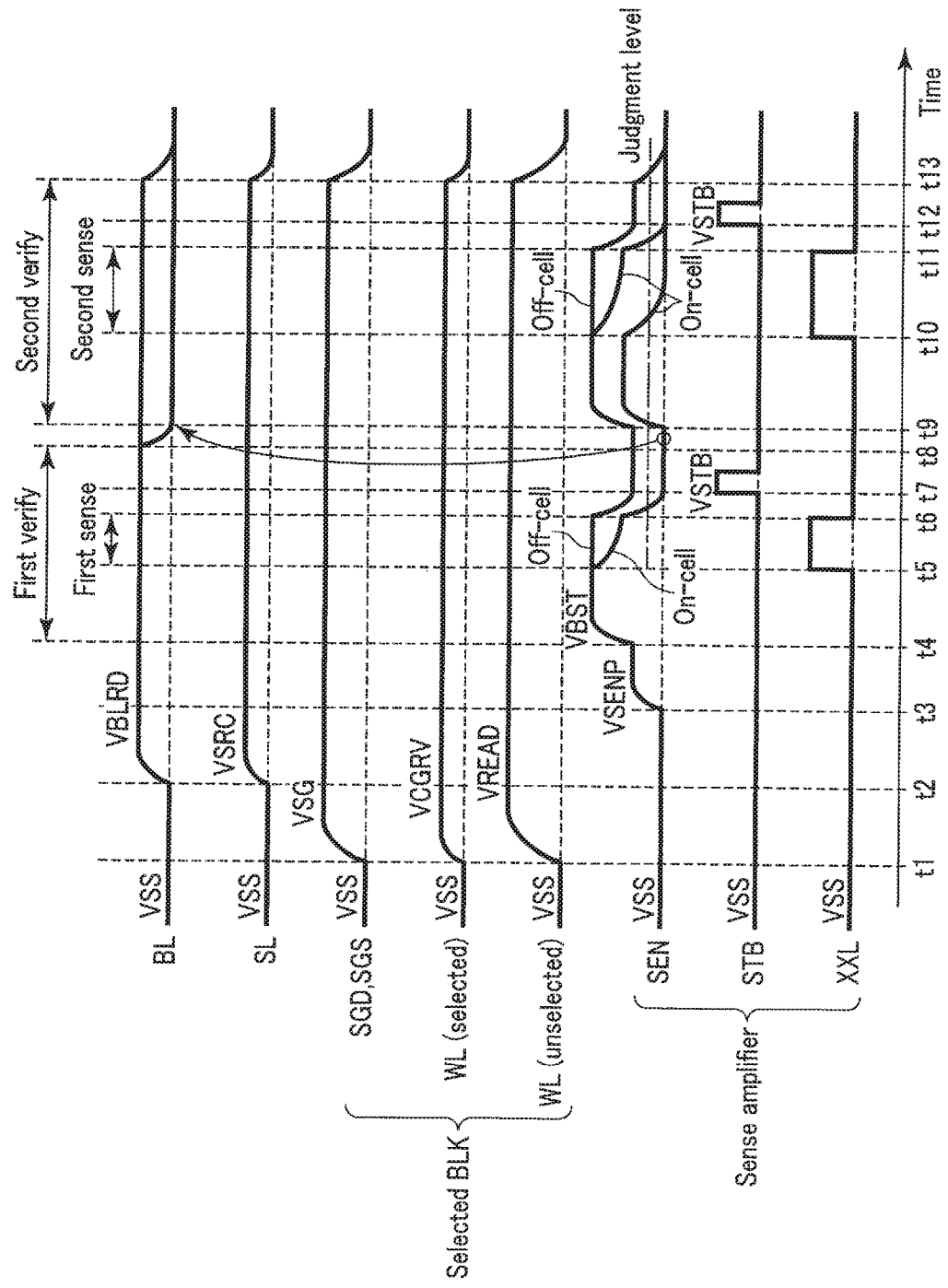
F I G. 13

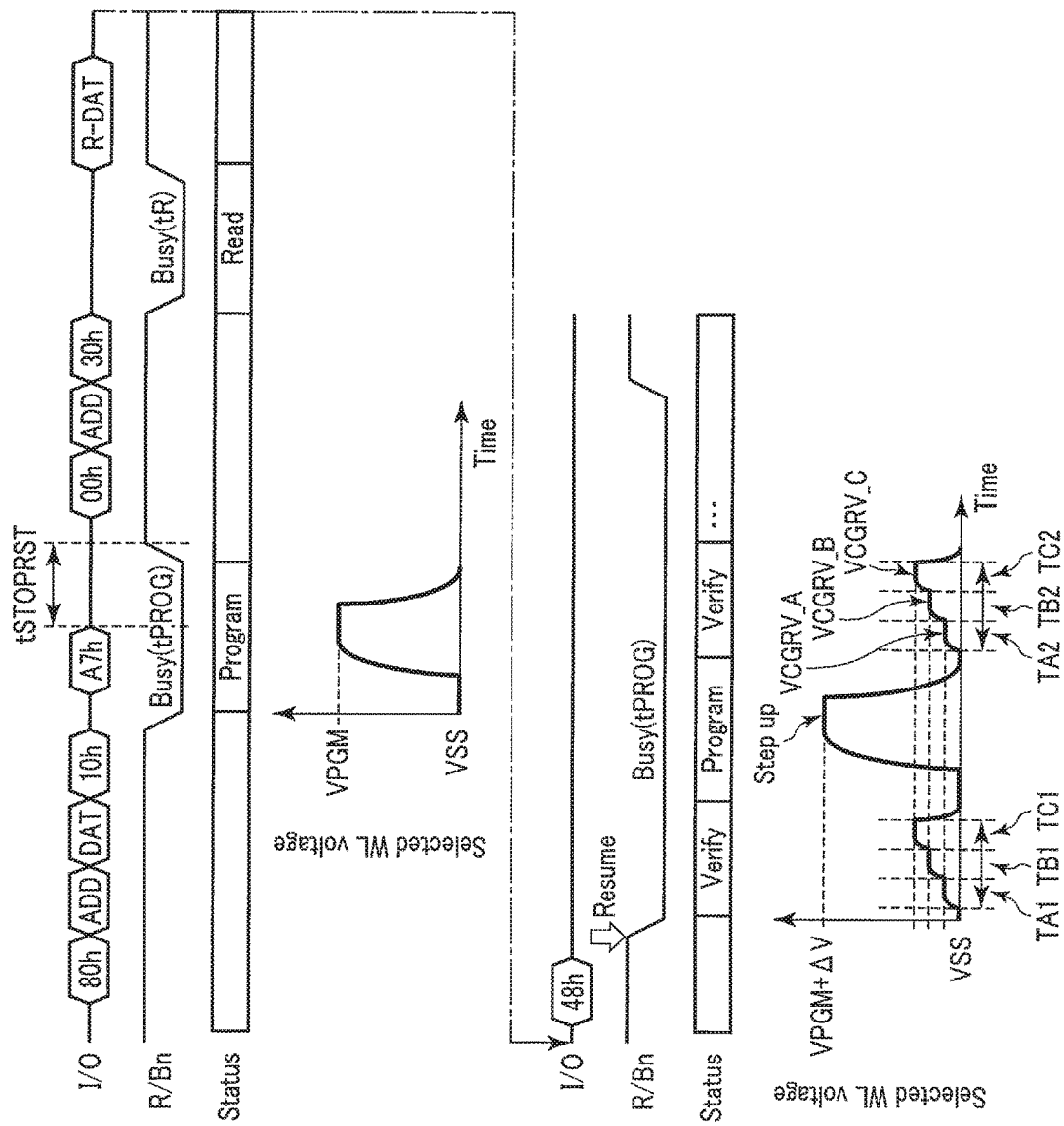
F I G. 15

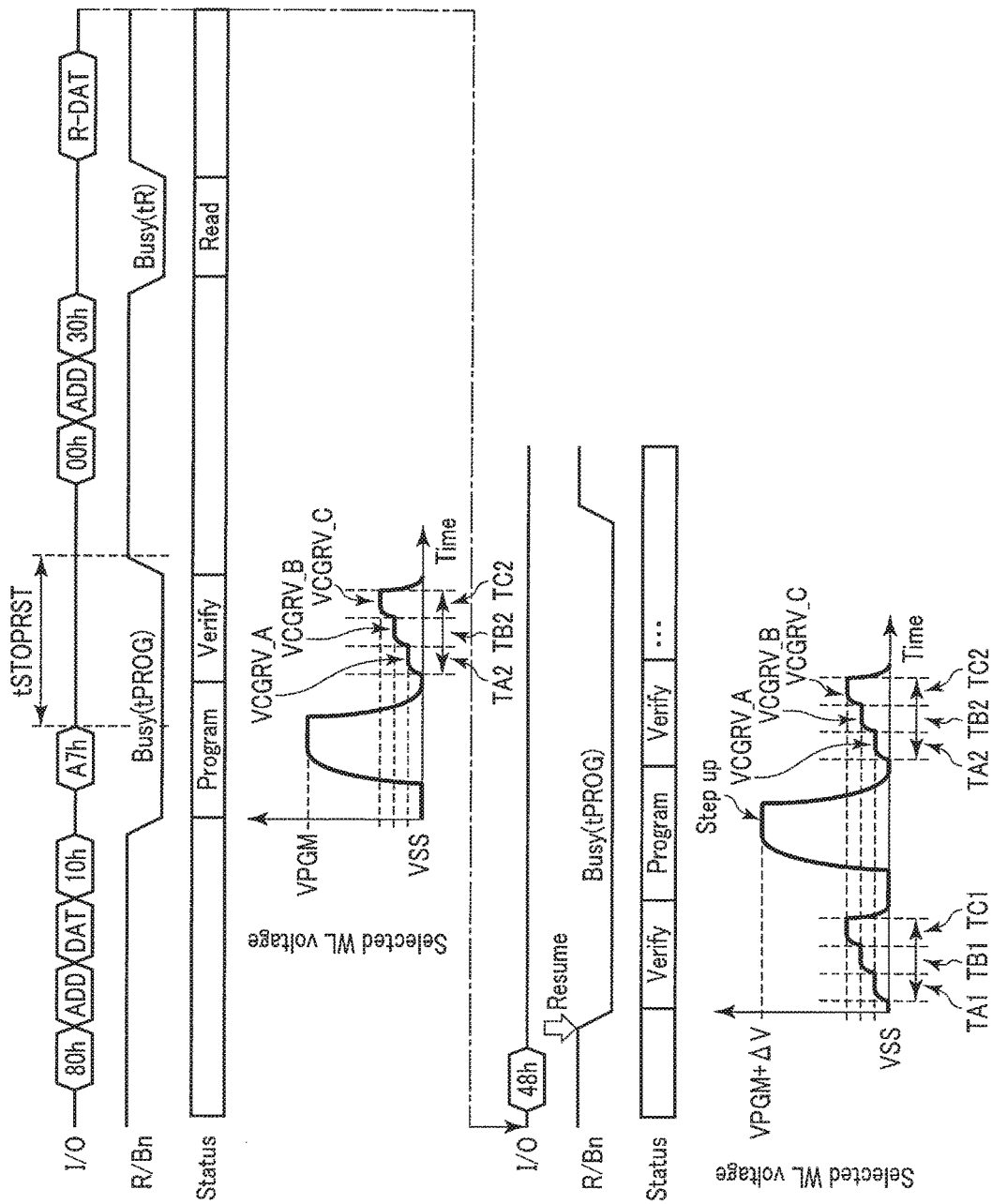
F I G. 20

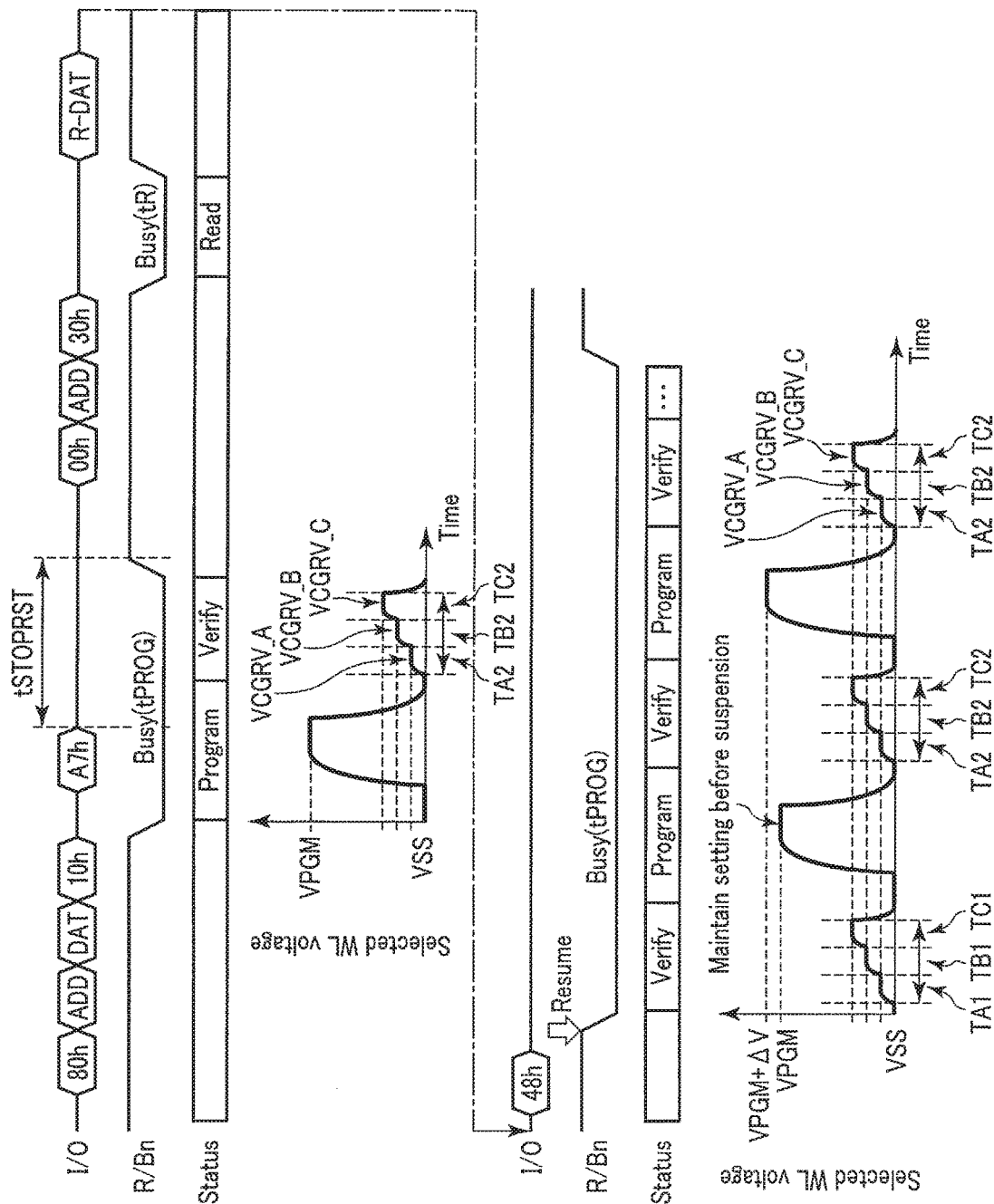
F I G. 23

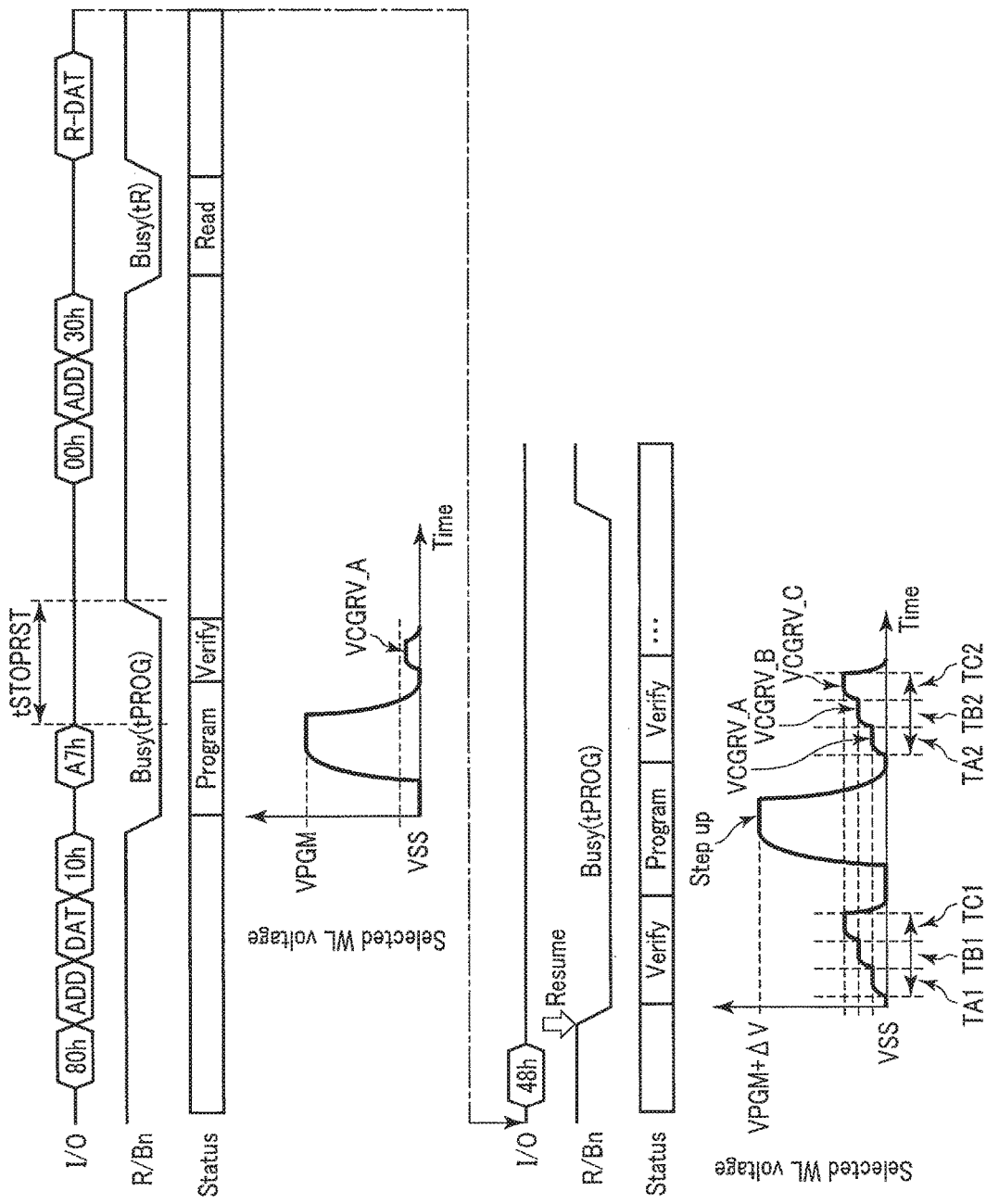
F I G. 26

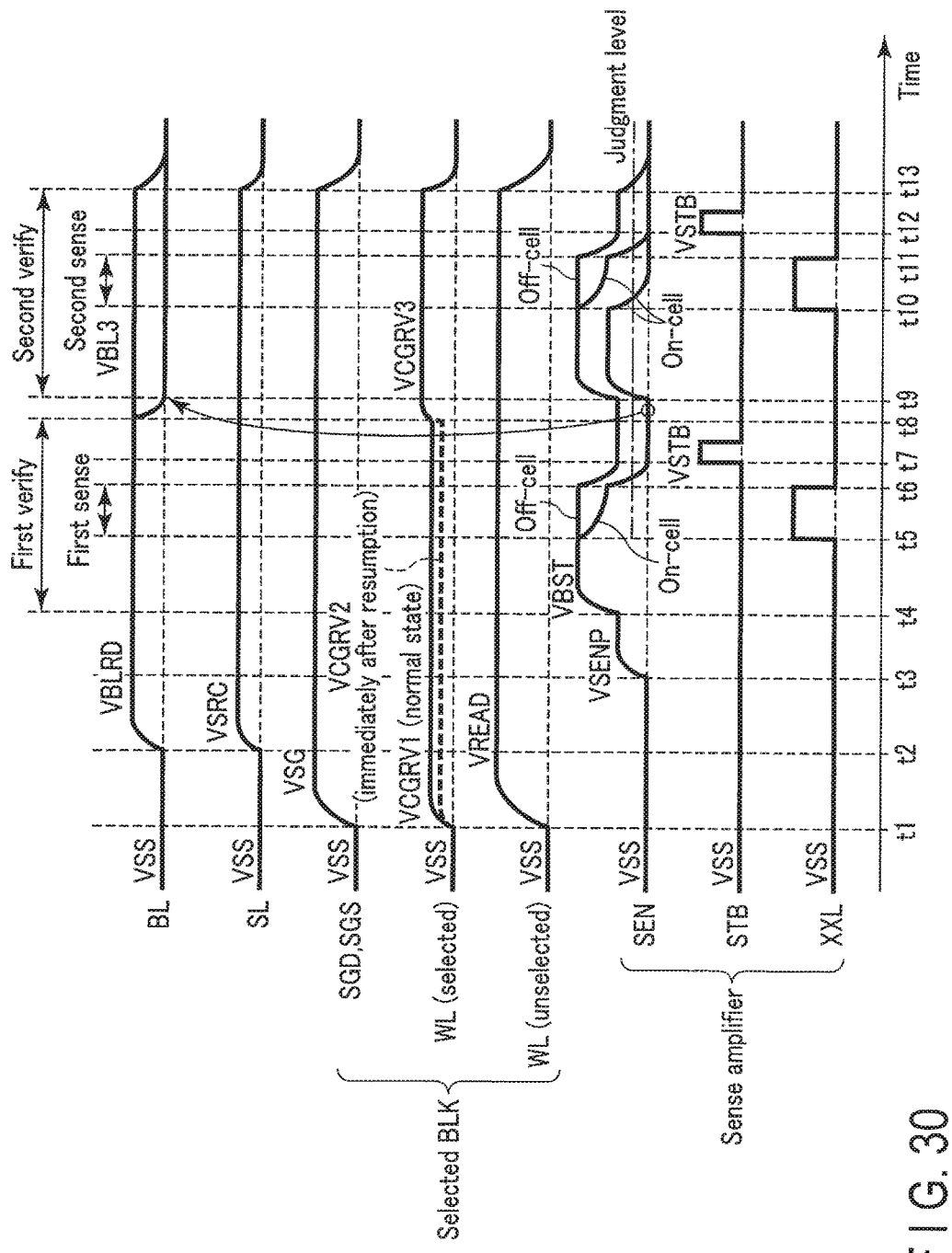
F I G. 30

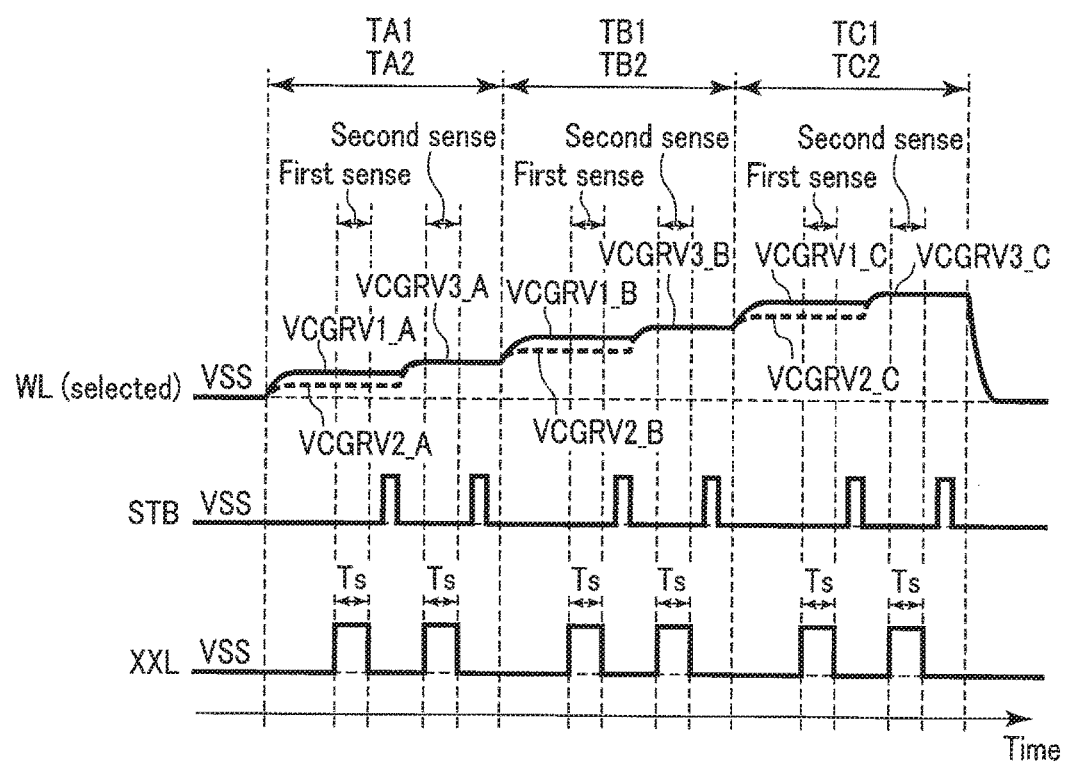
F I G. 31

SEMICONDUCTOR MEMORY DEVICE

CROSS-REFERENCE TO RELATED APPLICATIONS

This application is based upon and claims the benefit of priority from Japanese Patent Application No. 2017-034599, filed Feb. 27, 2017, the entire contents of which are incorporated herein by reference.

FIELD

Embodiments described herein relate generally to a semiconductor memory device and a memory system.

BACKGROUND

A NAND-type flash memory is known as a semiconductor memory device.

BRIEF DESCRIPTION OF THE DRAWINGS

FIG. 13 is a timing chart showing a voltage in each interconnect during a verify operation in the semiconductor memory device according to the first embodiment;

FIG. 15 is a timing chart showing a write operation including suspension in the memory system comprising the semiconductor memory device according to the first embodiment;

FIG. 20 is a timing chart showing a write operation including suspension in a memory system comprising the semiconductor memory device according to the second embodiment;

FIG. 23 is a timing chart showing a write operation including suspension in a memory system comprising the semiconductor memory device according to the third embodiment;

FIG. 26 is a timing chart showing a write operation including suspension in the memory system comprising the semiconductor memory device according to the fourth embodiment;

FIG. 30 is a timing chart showing a voltage in each interconnect during a verify operation in the semiconductor memory device according to a first modification; and FIG. 31 is a timing chart showing voltages of a selected word line, a signal STB, and a signal XXL in a normal-state verify period and in a verify period immediately after resumption, in the semiconductor memory device according to the first modification.

DETAILED DESCRIPTION

In general, according to one embodiment, a semiconductor memory device includes a memory cell, a bit line coupled to the memory cell, a sense amplifier coupled to the bit line, a word line coupled to a gate of the memory cell, and a row decoder coupled to the word line. A write operation repeats a program loop including a program operation, a first verify operation performed after the program operation, and a second verify operation performed after the first verify operation. The row decoder applies a first read voltage to the word line in the first and second verify operations. When the write operation is not suspended, the sense amplifier senses a voltage of the bit line for a first sense period in the first verify operation. When the write operation is suspended, the sense amplifier senses the voltage of the bit line for a second sense period shorter than the first sense period in the initial first verify operation after the resumption of the write operation. The sense amplifier senses the voltage of the bit line for a third sense period longer than the first sense period in the second verify operation.

1. First Embodiment

A semiconductor memory device according to a first embodiment is described. A three-dimensionally stacked NAND-type flash memory in which memory cell transistors are three-dimensionally stacked above a semiconductor substrate is described below as a semiconductor memory device by way of example.

The semiconductor memory device according to the present embodiment has a function to temporarily stop (hereinafter also mentioned as "suspend") a write operation in response to, for example, a read instruction from an external device in the middle of the write operation of data, and restart (hereinafter also mentioned as "resume") the write operation after the execution of a read operation.

1.1 Configuration 1.1.1 Overall Configuration of Memory System

First, the overall configuration of a memory system comprising the semiconductor memory device according to the present embodiment is described with reference to FIG. 1.

Figure 1:
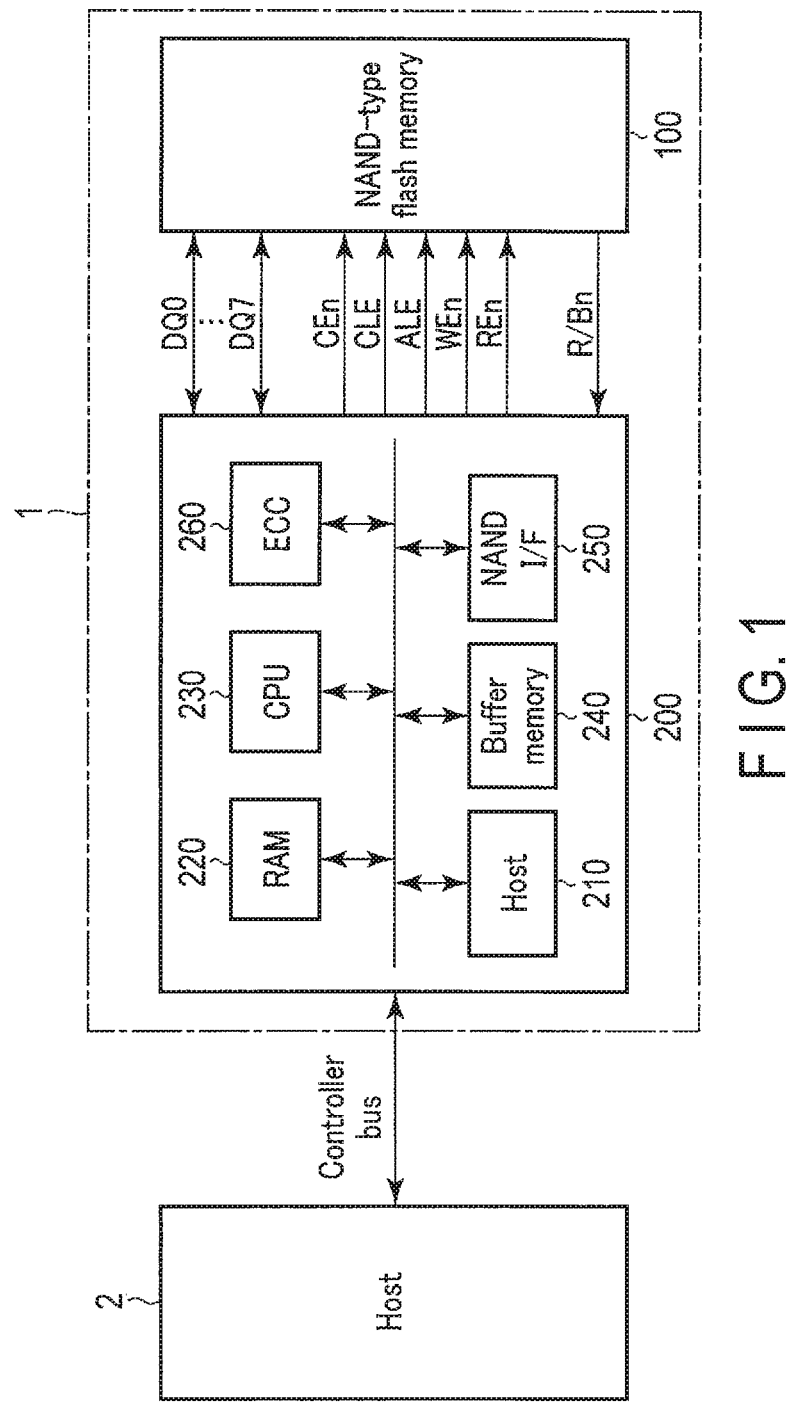
FIG. 1 is a block diagram of a memory system comprising a semiconductor memory device according to a first embodiment.

As shown in FIG. 1, a memory system 1 comprises a NAND-type flash memory 100 and a controller 200. The controller 200 and the NAND-type flash memory 100 may be, for example, combined into a semiconductor memory device, examples of which include a memory card such as an SD™ card, or a solid state drive (SSD).

The NAND-type flash memory 100 comprises memory cell transistors, and stores data in a non-volatile manner. The NAND-type flash memory 100 is coupled to the controller 200 by a NAND bus, and operates under an instruction from the controller 200. More specifically, the NAND-type flash memory 100 sends and receives, for example, 8-bit input/output signals I/O to and from the controller 200 via data lines DQ0 to DQ7. The input/output signals I/O are, for example, data, addresses, and commands. The NAND-type flash memory 100 also receives, from the controller 200, for example, a chip enable signal CEn, a command latch enable signal CLE, an address latch enable signal ALE, a write enable signal WEn, and a read enable signal REn. The NAND-type flash memory 100 then sends a ready/busy signal R/Bn to the controller 200.

The chip enable signal CEn is a signal to enable the NAND-type flash memory 100, and is asserted, for example, at a low ("L") level. The command latch enable signal CLE is a signal indicating that the input/output signal I/O is a command, and is asserted, for example, at a high ("H") level. The address latch enable signal ALE is a signal indicating that the input/output signal I/O is an address, and is asserted, for example, at the H level. The write enable signal WEn is a signal to load a received signal into the NAND-type flash memory 100, and is asserted, for example, at the "L" level every time a command, an address, data, and others are received from the controller 200. Thus, the input/output signal I/O is loaded into the NAND-type flash memory 100 every time the WEn is toggled. The read enable signal REn is a signal for the controller 200 to read data from the NAND-type flash memory 100. The read enable signal REn is asserted, for example, at the "L" level. The ready/busy signal R/Bn is a signal indicating whether or not the NAND-type flash memory 100 is busy (whether or not the NAND-type flash memory 100 is unready to receive a command from the controller 200), and is brought to the "L" level, for example, when the NAND-type flash memory 100 is busy.

The controller 200 instructs the NAND-type flash memory 100 to read, write, or erase data in response to an instruction from a host device 2. The controller 200 also manages a memory space of the NAND-type flash memory 100.

The controller 200 includes a host interface circuit 210, an internal memory (RAM) 220, a processor (CPU) 230, a buffer memory 240, a NAND interface circuit 250, and an ECC circuit 260.

The host interface circuit 210 is coupled to the host device 2 via a controller bus, and has control over a communication with the host device 2. The host interface circuit 210 transfers an instruction and data received from the host device 2, to the processor 230 and the buffer memory 240. The host interface circuit 210 also transfers data in the buffer memory 240 to the host device 2 in response to an instruction from the processor 230.

The NAND interface circuit 250 is coupled to the NAND-type flash memory 100 via the NAND bus, and has control over the NAND-type flash memory 100. The NAND interface circuit 250 transfers, to the NAND-type flash memory 100, an instruction received from the processor 230. The NAND interface circuit 250 also transfers write data in the buffer memory 240 to the NAND-type flash memory 100 at the time of writing. Moreover, at the time of reading, the NAND interface circuit 250 transfers, to the buffer memory 240, data read from the NAND-type flash memory 100.

The processor 230 controls the operation of the entire controller 200. For example, when the processor 230 has received a write instruction from the host device 2, the processor 230 outputs a write instruction to the NAND-type flash memory 100 accordingly. The same applies to reading and erasing. The processor 230 also performs various kinds of processing, such as wear leveling, to manage the NAND-type flash memory 100. In addition, the processor 230 performs various kinds of logic operations. For example, the processor 230 performs data encryption processing and randomizing processing.

The ECC circuit 260 performs error checking and correcting (ECC) processing.

The internal memory 220 is a semiconductor memory such as a DRAM, and is used as a work area of the processor 230. The internal memory 220 holds firmware to manage the NAND-type flash memory 100, various management tables, and others.

1.1.2 Configuration of Semiconductor Memory Device

Next, the configuration of the semiconductor memory device is described with reference to FIG. 2.

Figure 2:
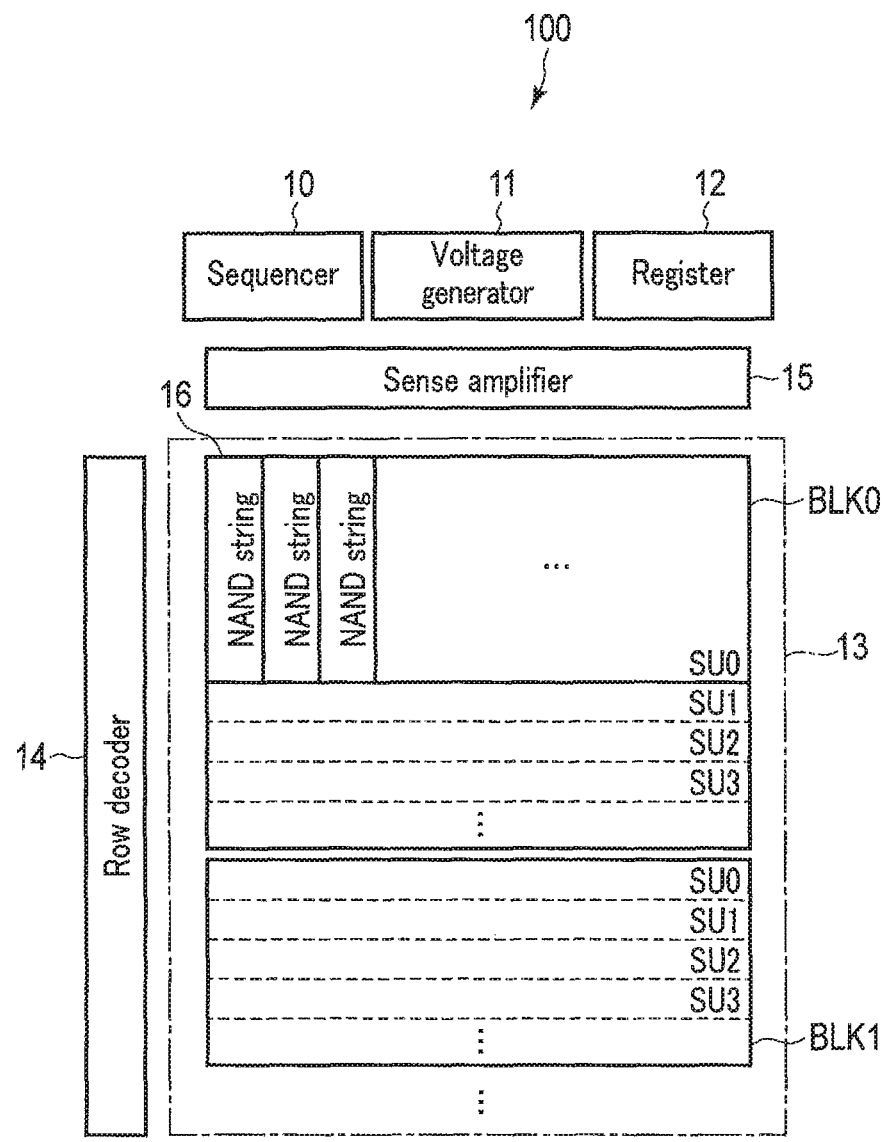
FIG. 2 is a block diagram of the semiconductor memory device according to the first embodiment.

As shown in FIG. 2, the NAND-type flash memory 100 includes a sequencer 10, a voltage generator 11, a register 12, a memory cell array 13, a row decoder 14, and a sense amplifier 15.

The memory cell array 13 comprises blocks BLK (BLK0, BLK1, . . . ) including non-volatile memory cell transistors (hereinafter also mentioned as "memory cells") associated with rows and columns. Each of the blocks BLK includes string units SU (SU0, SU1, SU2, SU3, . . . ). Each of the string units SU includes NAND strings 16. The memory cell array 13 has therein any number of blocks BLK, and each of the blocks BLK has therein any number of string units SU. Details of the memory cell array 13 will be described later.

The row decoder 14 decodes a row address provided from the controller 200. The row decoder 14 selects one of the blocks BLK on the basis of the decoding result, and further selects one of the string units SU. The row decoder 14 then outputs a necessary voltage to the block BLK.

During a data read operation, the sense amplifier 15 senses data read from the memory cell array 13. The sense amplifier 15 then outputs the read data to the controller 200. During a data write operation, the sense amplifier 15 transfers, to the memory cell array 13, write data received from the controller 200.

The sequencer 10 controls the operation of the whole NAND-type flash memory 100.

The voltage generator 11 generates a voltage necessary for data writing, reading, and erasing under the control of the sequencer 10, and applies this generated voltage to the row decoder 14, the sense amplifier 15, and others. The row decoder 14 and the sense amplifier 15 apply the voltage supplied from the voltage generator 11, to the memory cell transistors in the memory cell array 13.

The register 12 holds various signals. For example, the register 12 holds status information at the time of the suspension of the write operation (hereinafter referred to as "suspend information"). The sequencer 10 resumes the write operation on the basis of the suspend information held by the register 12. The register 12 can also hold various tables.

1.1.3 Regarding Configuration of Memory Cell Array

Next, the configuration of the memory cell array 13 is described with reference to FIG. 3. While the example in FIG. 3 shows the block BLK0, the configurations of the other blocks BLK are the same.

Figure 3:
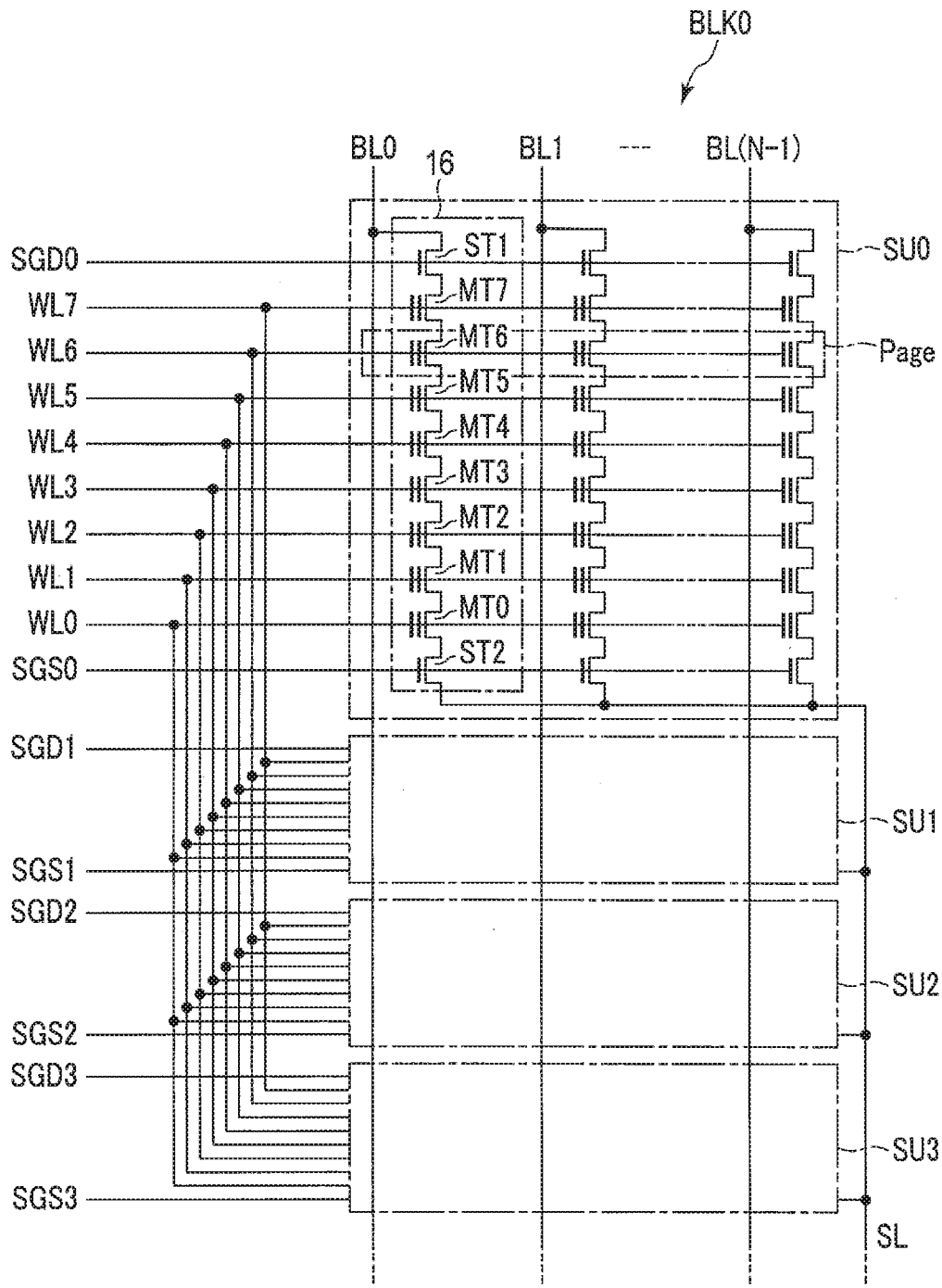
FIG. 3 is a circuit diagram of a memory cell array provided in the semiconductor memory device according to the first embodiment.

As shown in FIG. 3, the block BLK0 includes, for example, four string units SU (SU0 to SU3). Further, each of the string units SU includes the NAND strings 16. Each of the NAND strings 16 includes, for example, 8 memory cell transistors MT0 to MT7, and select transistors ST1 and ST2. The memory cell transistors MT0 to MT7 will be hereinafter mentioned as a memory cell transistor MT unless otherwise specified. The memory cell transistor MT comprises a control gate and a charge storage layer, and holds data in a non-volatile manner.

The memory cell transistor MT may be a MONOS type that uses an insulating film for the charge storage layer, or may be an FG type that uses an electric conductive layer for the charge storage layer. The MONOS type is described below by way of example in the present embodiment. The number of the memory cell transistors MT is not limited to 8, and may be, but not exclusively, for example, 16, 32, 64, or 128. Moreover, any number of select transistors ST1 and any number of select transistors ST2 are provided, and one or more select transistors ST1 and one or more select transistors ST2 have only to be provided.

The memory cell transistors MT are coupled in series between a source of the select transistor ST1 and a drain of the select transistor ST2. More specifically, the memory cell transistors MT0 to MT7 have their electric current paths coupled in series. Therefore, a drain of the memory cell transistor MT7 is coupled to the source of the select transistor ST1, and a source of the memory cell transistor MT0 is coupled to the drain of the select transistor ST2.

A gate of the select transistor ST1 in each of the string units SU0 to SU3 is coupled to each of select gate lines SGD0 to SGD3. Similarly, a gate of the select transistor ST2 in each of the string units SU0 to SU3 is coupled to each of select gate lines SGS0 to SGS3. The select gate lines SGD0 to SGD3 will be hereinafter mentioned as a select gate line SGD unless otherwise specified. The select gate lines SGS0 to SGS3 will be hereinafter mentioned as a select gate line SGS unless otherwise specified. The select gate lines SGS0 to SGS3 of each of the string units SU may be coupled in common.

The control gates of the memory cell transistors MT0 to MT7 in the block BLK are coupled in common to word lines WL0 to WL7, respectively. The word lines WL0 to WL7 will be hereinafter mentioned as a word line WL unless otherwise specified.

Drains of the select transistors ST1 of the NAND strings 16 in the string unit SU are coupled to different bit lines BL0 to BL(N−1) (N is an integer equal to or greater than 2). The bit lines BL0 to BL(N−1) will be hereinafter mentioned as a bit line BL unless otherwise specified. Each bit line BL couples, in common, one NAND string 16 in each of the string units SU among the blocks BLK. Thus, sources of the select transistors ST2 are coupled to a source line SL in common. The string unit SU is an aggregate of the NAND strings 16 coupled to different bit lines BL and coupled to the same select gate lines SGD and SGS. Also, the block BLK is an aggregate of the string units SU having the word line WL in common. The memory cell array 13 is an aggregate of the blocks BLK having the bit line BL in common.

Data can be erased in units of blocks BLK or in units smaller than the blocks BLK. An erasing method is described in, for example, U.S. patent application Ser. No. 13/235,389 filed Sep. 18, 2011, "NONVOLATILE SEMICONDUCTOR MEMORY DEVICE". Another erasing method is described in U.S. patent application Ser. No. 12/694,690 filed Jan. 27, 2010, "NON-VOLATILE SEMICONDUCTOR STORAGE DEVICE". Yet another erasing method is described in U.S. patent application Ser. No. 13/483,610 filed May 30, 2012, "NONVOLATILE SEMICONDUCTOR MEMORY DEVICE AND DATA ERASE METHOD THEREOF". The entire contents of these patent applications are incorporated herein by reference.

Furthermore, the configuration of the memory cell array 13 may be some other configuration. The configuration of the memory cell array 13 is described in, for example, U.S. patent application Ser. No. 12/407,403 filed Mar. 19, 2009, "THREE DIMENSIONAL STACKED NONVOLATILE SEMICONDUCTOR MEMORY". The configuration of the memory cell array 13 is also described in U.S. patent application Ser. No. 12/406,524 filed Mar. 18, 2009, "THREE DIMENSIONAL STACKED NONVOLATILE SEMICONDUCTOR MEMORY", U.S. patent application Ser. No. 12/679,991 filed Mar. 25, 2010, "NON-VOLATILE SEMICONDUCTOR STORAGE DEVICE AND METHOD OF MANUFACTURING THE SAME", and U.S. patent application Ser. No. 12/532,030 filed Mar. 23, 2009, "SEMICONDUCTOR MEMORY AND METHOD FOR MANUFACTURING SAME". The entire contents of these patent applications are incorporated herein by reference.

1.1.4 Sectional Configuration of Memory Cell Array

Figure 4:
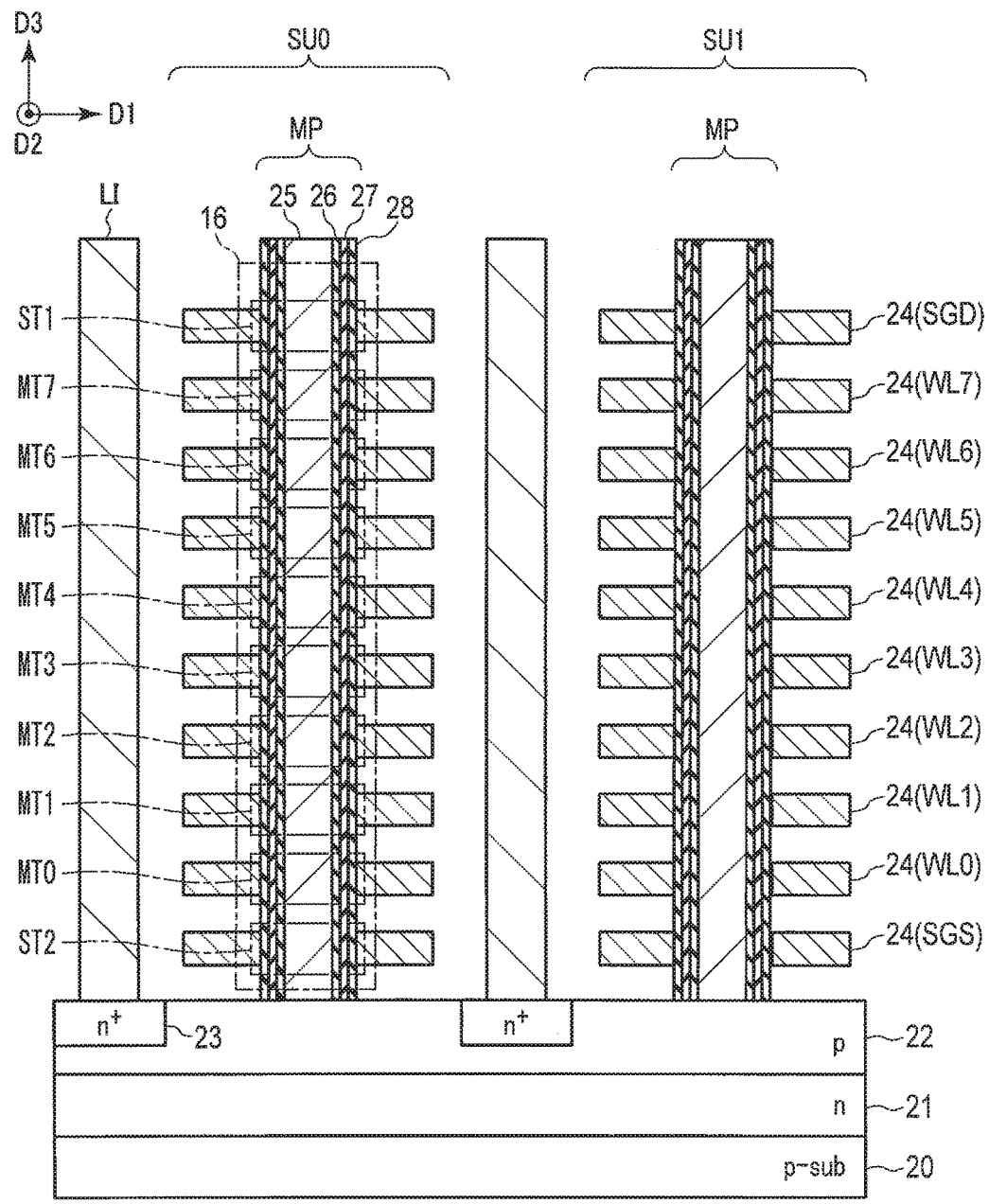
FIG. 4 is a sectional view of the memory cell array provided in the semiconductor memory device according to the first embodiment.

Next, the sectional configuration of the memory cell array 13 is described with reference to FIG. 4. The example in FIG. 4 shows the sections of the string units SU0 and SU1, and the string units SU2 and SU3 are similar in configuration. In FIG. 4, interlayer insulating films are omitted.

As shown in FIG. 4, source line contacts LI extending in a second direction D2 parallel to a semiconductor substrate 20 and perpendicular to a first direction D1 are provided along the first direction D1 parallel to the semiconductor substrate 20. One string unit SU is disposed between two source line contacts LI. The source line contacts LI couple the semiconductor substrate 20 to the unshown source line SL provided above the NAND strings 16. The source line contacts LI and the NAND strings 16 can be set at any locations. For example, more than one string unit SU may be provided between two source line contacts LI. In addition, although the NAND strings 16 are aligned along the second direction D2 in one string unit SU for the simplification of explanation in the example shown in FIG. 4, any arrangement of the NAND strings 16 in one string unit SU can be set. For example, the NAND strings 16 may be arranged in two parallel rows along the second direction D2, or may be arranged zigzag in four rows.

In each of the string units SU, the NAND string 16 is formed along a third direction D3 perpendicular to the semiconductor substrate 20. More specifically, an n-type well 21 is provided in a surface region of the semiconductor substrate 20. A p-type well 22 is provided in a surface region of the n-type well 21. An n$^+$-type diffusion layer 23 is provided in a part of a surface region of the p-type well 22. Above the p-type well 22, ten interconnect layers 24 which function as the select gate line SGS, the word line WL, and the select gate line SGD are sequentially stacked via the unshown interlayer insulating films, respectively.

A pillar-shaped semiconductor layer 25 that reaches the p-type well 22 through the ten interconnect layers 24 is formed. A tunnel insulating film 26, a charge storage layer 27, and a block insulating film 28 are sequentially formed on the side surface of the semiconductor layer 25. Poly-silicon, for example, is used in the semiconductor layer 25. In the tunnel insulating film 26 and the block insulating film 28, silicon oxide films, for example, are used. A silicon nitride film, for example, is used for the charge storage layer 27. A pillar formed by the semiconductor layer 25, the tunnel insulating film 26, the charge storage layer 27, and the block insulating film 28 will be hereinafter referred to as a "memory pillar MP". The semiconductor layer 25 functions as an electric current path of the NAND string 16, and serves as region where a channel of each transistor is formed. The upper end of the semiconductor layer 25 is coupled to a interconnect layer (not shown) which functions as the bit line BL.

The memory cell transistor MT, and the select transistors ST1 and ST2 are formed by the memory pillar MP and the interconnect layer 24. Although one interconnect layer 24 which functions as each of the select gate lines SGD and SGS is provided in the example in FIG. 4, more than one interconnect layer 24 may be provided.

The source line contact LI has a linear shape along the second direction D2. The source line contact LI uses, for example, poly-silicon. The bottom surface of the source line contact LI is coupled to the n$^+$-type diffusion layer 23, and the top surface thereof is coupled to a interconnect layer (not shown) that functions as the source line SL.

1.1.5 Configuration of Sense Amplifier

Next, the configuration of the sense amplifier 15 is described. The sense amplifier 15 includes sense amplifier units SAU and latch circuits XDL.

Each of the sense amplifier units SAU is provided in, for example, each of the bit lines BL, senses data read in the corresponding bit line BL, and transfers write data to the corresponding bit line BL. Each of the latch circuits XDL is provided in each of the sense amplifier units SAU, and temporarily holds relevant data in the corresponding bit line BL.

Next, the configuration of the sense amplifier unit SAU is described with reference to FIG. 5. Although the sense amplifier unit SAU of an electric current sensing type that senses an electric current flowing through the bit line BL is described by way of example in the present embodiment, the sense amplifier unit SAU of a voltage sensing type may be used instead.

Figure 5:
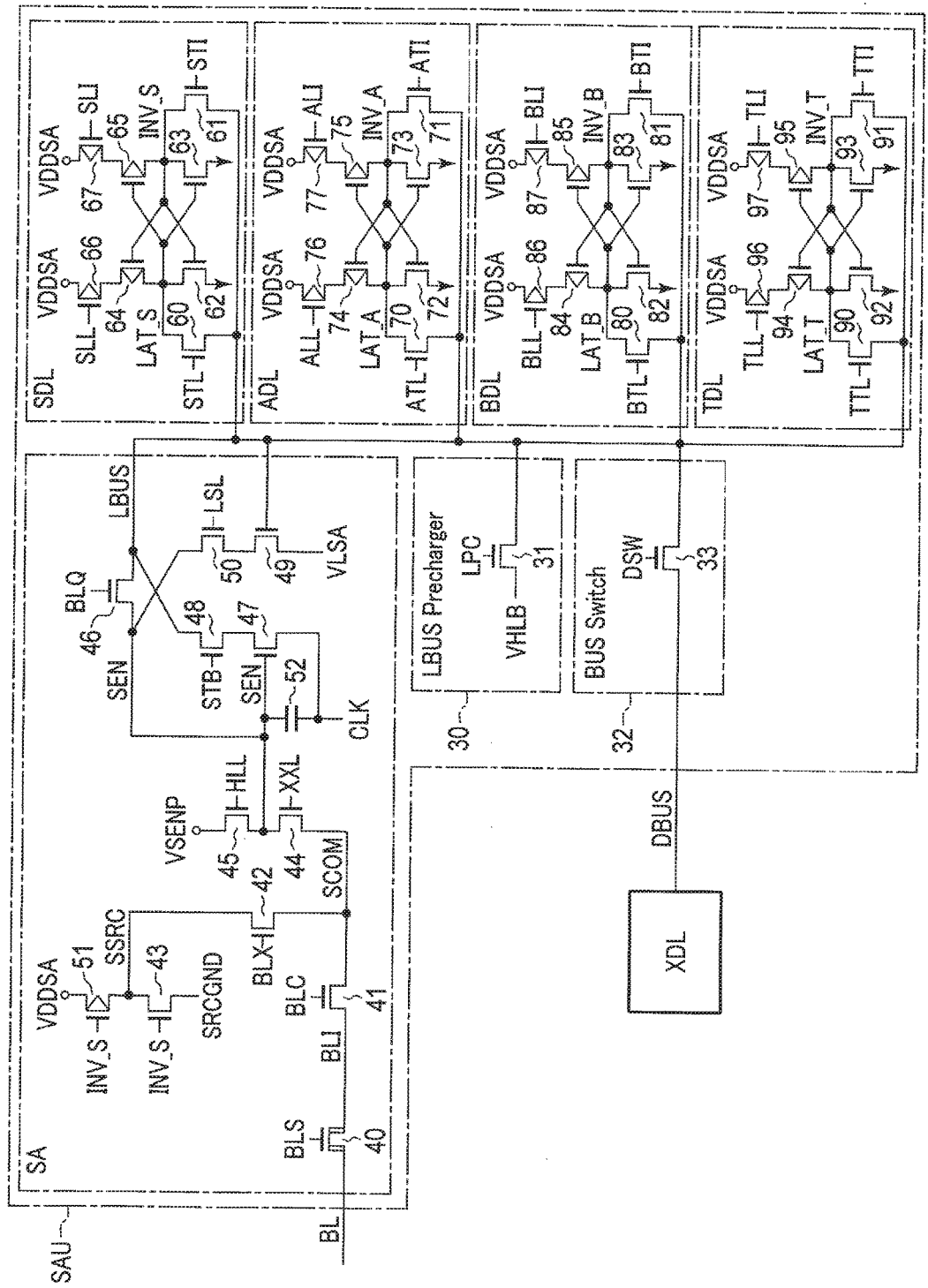
FIG. 5 is a circuit diagram of a sense amplifier provided in the semiconductor memory device according to the first embodiment.

As shown in FIG. 5, the sense amplifier unit SAU includes a sense circuit SA, for example, four latch circuits (SDL, ADL, BDL, and TDL), a precharge circuit 30, and a bus switch 32.

The sense circuit SA senses data read in the bit line BL (hereinafter referred to as "read data"), and applies a voltage to the bit line BL in accordance with write data (hereinafter referred to as "program data"). That is, the sense circuit SA directly controls the bit line BL.

Next, details of the sense circuit SA are described. In the following explanation, a source or drain of a transistor is referred to as "one end of the transistor", and the other is referred to as "the other end of the transistor".

The sense circuit SA comprises a high breakdown voltage n-channel MOS transistor 40, low breakdown voltage n-channel MOS transistor 41 to 50, a low breakdown voltage p-channel MOS transistor 51, and a capacitive element 52.

A signal BLS is input to a gate of the transistor 40. One end of the transistor 40 is coupled to the corresponding bit line BL, and the other end of the transistor 40 is coupled to a node BLI.

A signal BLC is input to a gate of the transistor 41. One end of the transistor 41 is coupled to the node BLI, and the other end of the transistor 41 is coupled to a node SCOM. The transistor 41 clamps the corresponding bit line BL at a potential corresponding to the signal BLC.

A signal BLX is input to a gate of the transistor 42. One end of the transistor 42 is coupled to the node SCOM, and the other end of the transistor 42 is coupled to a node SSRC.

A gate of the transistor 43 is coupled to a node INV_S. One end of the transistor 43 is coupled to the node SSRC, and the other end of the transistor 43 is coupled to a node SRCGND. For example, a ground voltage VSS is applied to the node SRCGND.

A gate of the transistor 51 is coupled to a node INV_S. A power source voltage VDDSA is applied to one end of the transistor 51, and the other end of the transistor 51 is coupled to the node SSRC.

A signal XXL is input to a gate of the transistor 44. One end of the transistor 44 is coupled to the node SCOM, and the other end of the transistor 44 is coupled to a node SEN.

A signal HLL is input to a gate of the transistor 45. A voltage VSENP is applied to one end of the transistor 45, and the other end of the transistor 45 is coupled to the node SEN.

One electrode of the capacitive element 52 is coupled to the node SEN, and a clock signal CLK is input to the other electrode of the capacitive element 52.

A gate of the transistor 47 is coupled to the node SEN. One end of the transistor 47 is coupled to one end of the transistor 48, and the clock signal CLK is input to the other end of the transistor 47. The transistor 47 functions as a sense transistor that senses the voltage of the node SEN.

A signal STB is input to a gate of the transistor 48. The other end of the transistor 48 is coupled to a bus LBUS.

A signal BLQ is input to a gate of the transistor 46. One end of the transistor 46 is coupled to the node SEN, and the other end of the transistor 46 is coupled to the bus LBUS.

A gate of the transistor 49 is coupled to the bus LBUS. One end of the transistor 49 is coupled to one end of the transistor 50, and a voltage VLSA is applied to the other end of the transistor 49. The voltage VLSA may be, for example, the ground voltage VSS.

A signal LSL is input to a gate of the transistor 50. The other end of the transistor 50 is coupled to the node SEN.

The latch circuits SDL, ADL, BDL, and TDL temporarily hold data. At the time of data writing, the sense circuit SA controls the bit lines BL in accordance with the held data in the latch circuit SDL. The other latch circuits ADL, BDL, and TDL are used, for example, for a multivalued action in which the individual memory cell transistor holds data of 2 or more bits. Any number of latch circuits can be set, and the number of latch circuits is set, for example, in accordance with the amount of data (number of bits) that can be held by the memory cell transistor.

The latch circuit SDL comprises low breakdown voltage n-channel MOS transistors 60 to 63 and low breakdown voltage p-channel MOS transistors 64 to 67.

A signal STL is input to a gate of the transistor 60. One end of the transistor 60 is coupled to the bus LBUS, and the other end of the transistor 60 is coupled to a node LAT_S.

A signal STI is input to a gate of the transistor 61. One end of the transistor 61 is coupled to the bus LBUS, and the other end of the transistor 61 is coupled to a node INV_S.

A gate of the transistor 62 is coupled to the node INV_S. One end of the transistor 62 is grounded, and the other end of the transistor 62 is coupled to the node LAT_S.

A gate of the transistor 63 is coupled to the node LAT_S. One end of the transistor 63 is grounded, and the other end of the transistor 63 is coupled to the node INV_S.

A gate of the transistor 64 is coupled to the node INV_S. One end of the transistor 64 is coupled to the node LAT_S, and the other end of the transistor 64 is coupled to one end of the transistor 66.

A gate of the transistor 65 is coupled to the node LAT_S. One end of the transistor 65 is coupled to the node INV_S, and the other end of the transistor 65 is coupled to one end of the transistor 67.

A signal SLL is input to a gate of the transistor 66. The power source voltage VDDSA is applied to the other end of the transistor 66.

A signal SLI is input to a gate of the transistor 67. The power source voltage VDDSA is applied to the other end of the transistor 67.

In the latch circuit SDL, a first inverter is formed by the transistors 62 and 64, and a second inverter is formed by the transistors 63 and 65. The output of the first inverter and the input of the second inverter (the node LAT_S) is coupled to the bus LBUS via the transistor 60 for data transfer, and the input of the first inverter and the output of the second inverter (the node INV_S) is coupled to the bus LBUS via the transistor 61 for data transfer. The latch circuit SDL holds data in the node LAT_S, and holds its inverted data in the node INV_S.

The latch circuits ADL, BDL, and TDL have configurations similar to that of the latch circuit SDL so explanations thereof are omitted, but the reference sign and signal names of each transistor are differentiated from those of the latch circuit SDL as shown in FIG. 5 and are described below. The transistors 60 to 67 of the latch circuit SDL are equivalent to transistors 70 to 77 of the latch circuit ADL, transistors 80 to 87 of the latch circuit BDL, and transistors 90 to 97 of the latch circuit TDL, respectively. Furthermore, in each sense amplifier unit SAU, the sense circuit SA, and the four latch circuits SDL, ADL, BDL, and TDL are coupled to one another by the bus LBUS to be able to send and receive data.

The precharge circuit 30 precharges the bus LBUS. The precharge circuit 30 includes, for example, a low breakdown voltage n-channel MOS transistor 31. A signal LPC is input to a gate of the transistor 31. One end of the transistor 31 is coupled to the bus LBUS, and a voltage VHLB is applied to the other end of the transistor 31. Further, the precharge circuit 30 precharges the bus LBUS by transferring the voltage VHLB to the bus LBUS.

The bus switch 32 couples the bus LBUS to a bus DBUS. That is, the bus switch 32 couples the sense circuit SA to the latch circuit XDL. The bus switch 32 includes, for example, a low breakdown voltage n-channel MOS transistor 33. A signal DSW is input to a gate of the transistor 33. One end of the transistor 33 is coupled to the bus LBUS, and the other end of the transistor 33 is coupled to the latch circuit XDL via the bus DBUS.

Various signals in the sense amplifier unit SAU having the above configuration are given by, for example, the sequencer 10.

1.2 Threshold Distributions of Memory Cell Transistor

Next, threshold distributions that can be taken by the memory cell transistor MT according to the present embodiment are described with reference to FIG. 6. Although the memory cell transistor MT is capable of holding 4-value (2-bit) data in the case described below in the present embodiment, the data that can be held is not limited to 4 values. In the present embodiment, the memory cell transistor MT may be capable of holding, for example, 8-value (3-bit) data, and has only to be capable of holding data equal to or greater than two values (one bit).

Figure 6:
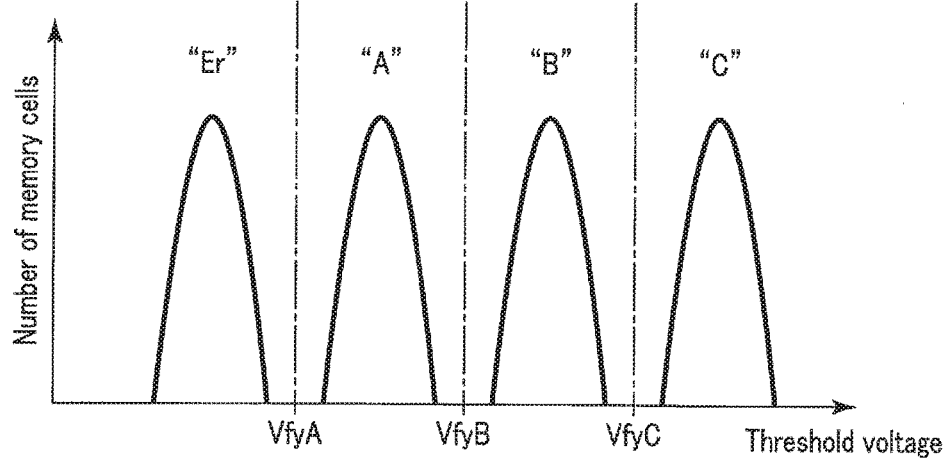
FIG. 6 is a threshold distribution diagram of a memory cell transistor provided in the semiconductor memory device according to the first embodiment.

As shown in FIG. 6, the threshold voltage of each of the memory cell transistors MT takes a value included in one of, for example, four discrete distributions. These four distributions are referred to as an "Er" level, an "A" level, a "B" level, and a "C" level, in ascending order of thresholds.

The "Er" level corresponds to, for example, an erase state of data. The threshold voltage included in the "Er" level is lower than a voltage VfyA, and has a positive or negative value.

The "A" to "C" levels correspond to a state where the charge storage layer is charged and data is written therein, and the threshold voltage included in each distribution has, for example, a positive value. The threshold voltage included in the "A" level is equal to or greater than the voltage VfyA, and is less than a voltage VfyB (however, VfyB>VfyA). The threshold voltage included in the "B" level is equal to or greater than the voltage VfyB, and is less than a voltage VfyC (however, VfyC>VfyB). The threshold voltage included in the "C" level is equal to or greater than the voltage VfyC, and is less than voltages VREAD and VPASS (VREAD (VPASS)>VfyC). The VREAD and VPASS are voltages which are applied to unselected word lines WL at the time of data reading and at the time of data writing.

As described above, each of the memory cell transistors MT has one of the four threshold distributions, and can thereby take four kinds of states. These states are allocated to "00" to "11" in binary notation so that each of the memory cell transistors MT can hold 2-bit data. Each of the 2-bit data will be hereinafter referred to as an upper bit and a lower bit. Moreover, an aggregate of upper bits that are collectively written (or collectively read) is referred to as upper page, and an aggregate of lower bits is referred to as a lower page.

Although the four levels are discretely distributed in the case described by way of example with reference to FIG. 6, this is, for example, an ideal state immediately after data writing. Therefore, adjacent levels can overlap in reality. For example, after writing of data, the upper end of the "Er" level may overlap the lower end of the "A" level because of disturbance, etc. In this case, for example, the ECC technique is used to correct data.

1.3 Regarding Write Operation

Next, the write operation is described. The write operation generally includes a program operation and verify operations. The threshold voltage of the memory cell transistor MT is raised to a target level by the repetition of the combination of the program operation and the verify operations (hereinafter referred to as a "program loop").

The program operation is an operation to charge the charge storage layer with electrons to raise the threshold voltage (or inhibit charging to maintain the threshold voltage). The operation to raise the threshold voltage will be hereinafter referred to as "'0' program' or "'0' write', and "0" data is given to the bit line BL targeted for the "0" program. On the other hand, the operation to maintain the threshold voltage will be referred to as "'1' program', '1' write', or 'write inhibit', and "1" data is given to the bit line BL targeted for the "1" program.

The verify operation is an operation to read data after the program operation, and determine whether or not the threshold voltage of the memory cell transistor MT has reached a desired target level. Hereinafter, the case where the threshold voltage of the memory cell transistor MT has reached the target level will be referred to as "verify operation has passed", whereas the case where the threshold voltage of the memory cell transistor MT has not reached the target level will be referred to as "verify operation has failed".

In the present embodiment, in the "0" program, a first program condition in which the fluctuation amount of the threshold voltage is relatively great, or a second program condition in which the fluctuation amount of the threshold voltage is smaller than in the first program condition is applied in accordance with the difference between a desired verify level (e.g. the voltage VfyA corresponding to the "A" level) and the threshold voltage of the memory cell transistor MT. For example, when the threshold voltage of the memory cell transistor MT is much lower than the verify level and does not reach the desired verify level in one program operation, the first program condition, in which the fluctuation amount of the threshold voltage is relatively great, is applied. In addition, the second program condition is applied in the case where the threshold voltage of the memory cell transistor MT is relatively close to the desired verify level and the threshold voltage far exceeds the verify level if the first program condition is applied.

More specifically, the voltage of the bit line BL varies between the first program condition and the second program condition. For example, the ground voltage VSS is applied to the bit line BL corresponding to the first program condition. Therefore, the voltage applied to the bit line BL corresponding to the second program condition is set to VQPW, and the voltage applied to the bit line BL corresponding to the "1" program is set to VBL. Thus, the voltage VSS, the voltage VQPW, and the voltage VBL have a relationship of VBL>VQPW>VSS.

Hereinafter, in the "0" program, the bit line to which the first program condition is applied will be mentioned as BL("0"), and the bit line to which the second program condition is applied will be mentioned as BL("QPW"). Moreover, the bit line corresponding to the "1" program will be referred to as BL("1").

1.3.1 Target Levels of Verify Operations

Next, the target level of the verify operation is described. In the present embodiment, first and second verify operations having different target levels are executed in accordance with the first and second program conditions. Therefore, the target level of the first verify operation varies between the case where suspension does not occur in the program loop (hereinafter referred to as a "normal state") and the case where suspension occurs in the program loop and the write operation is resumed (hereinafter referred to as "immediately after resumption"). That is, the target level of the initial first verify operation (the first verify operation of the first program loop) after resumption is different from the target level of the first verify operation in the normal state.

The target levels in the first and second verify operations are described with reference to FIG. 7. The example in FIG. 7 shows the target level in the case of writing from the "Er" level to the "A" level.

Figure 7:
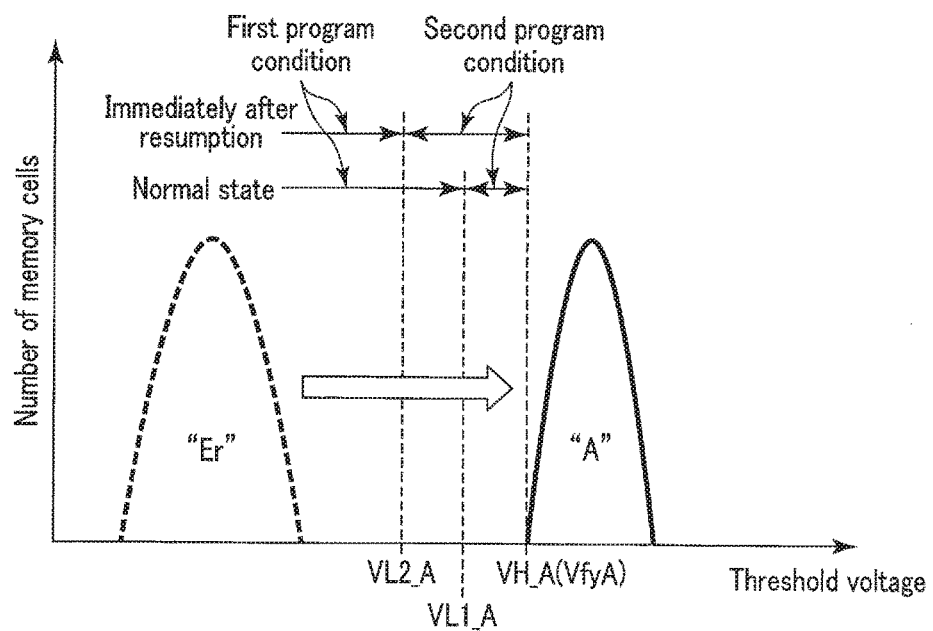
FIG. 7 is a diagram showing one example of target levels of verify operations in the semiconductor memory device according to the first embodiment.

As shown in FIG. 7, the target level of the second verify operation is set at, for example, the same voltage (VfyA) as that of the verify level. The target level of the second verify operation will be hereinafter mentioned as a voltage VH, and the voltage VH corresponding to, for example, the "A" level is mentioned as VH_A.

The target level of the first verify operation is set at a voltage lower than the voltage VH. Hereinafter, the target level of the first verify operation in the normal state will be mentioned as a voltage VL1, and the voltage VL1 corresponding to, for example, the "A" level will be mentioned as VL1_A. Also, the target level of the first verify operation immediately after resumption (the target level of the initial first verify operation after resumption) will be mentioned as a voltage VL2, and the voltage VL2 corresponding to, for example, the "A" level is mentioned as VL2_A. The voltages VH, VL1, and VL2 have a relationship of VH>VL1>VL2.

When the threshold voltage of the memory cell transistor is less than the voltage VL1 (or the voltage VL2) (threshold voltage <VL1 or VL2), it is determined that the first verify operation has failed, and the first program condition is applied in the next program loop. When the threshold voltage of the memory cell transistor is equal to or greater than the voltage VL1 (or the voltage VL2) and less than the voltage VH (VL1 or VL2≤threshold voltage <VH), it is determined that the first verify operation has passed and the second verify operation has failed, and the second program condition is applied in the next program loop. When the threshold voltage of the memory cell transistor is equal to or greater than the voltage VH (VH≤threshold voltage), it is determined that the second verify operation has passed, and writing is inhibited in the following program loop.

Next, the relation between the target level and a sense period is described with reference to FIG. 8. In the present embodiment, the period of sensing the voltage of the bit line BL, that is, the length of the period of bringing a signal XLL to the "H" level so that the charge in the node SEN is transferred to the bit line BL, varies depending on the target level. Hereinafter, the sense period in the first verify operation will be referred to as a "first sense period Ts_L"), and the sense period in the second verify operation will be referred to as a "second sense period Ts_H"). The first sense period in the normal state will be mentioned as Ts_L1, and the first sense period immediately after resumption (the first sense period in the initial first verify operation after resumption) will be mentioned as Ts_L2.

Figure 8:
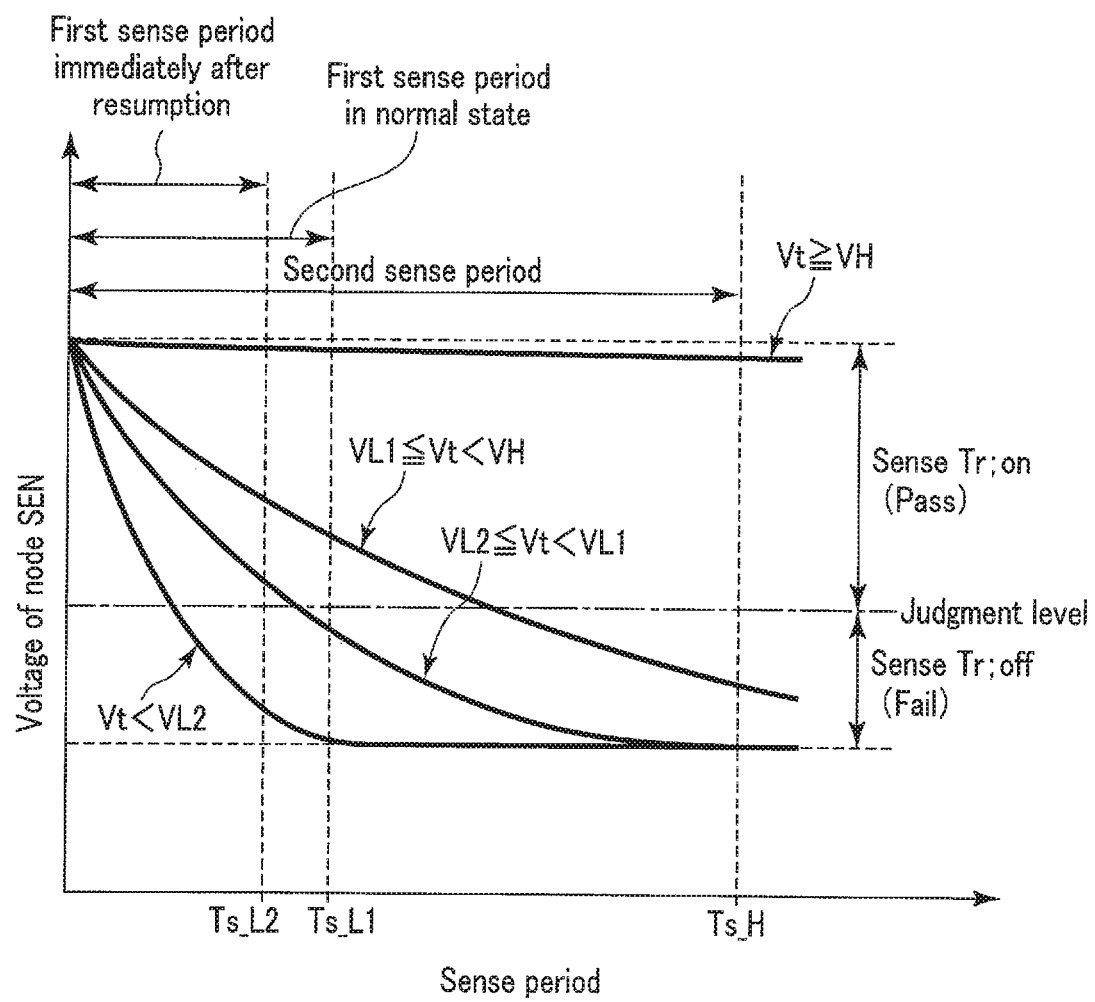
FIG. 8 is a graph showing the voltage of a node SEN and a sense period during a verify operation in the semiconductor memory device according to the first embodiment.

As shown in FIG. 8, the voltage of the node SEN decreases if the charge in the node SEN is transferred to the bit line BL in the sense period. In this instance, the speed at which the voltage of the node SEN decreases varies depending on a threshold voltage Vt of the memory cell transistor MT. For example, when threshold voltage Vt is less than the voltage VL2 (Vt<VL2), the memory cell transistor MT is in a strong on-state, and the voltage of the node SEN rapidly decreases. When the threshold voltage Vt is equal to or greater than the voltage VL2 and less than the voltage VL1 (VL2≤Vt<VL1), the memory cell transistor MT is in a weaker on-state than when Vt<VL2, and the voltage of the node SEN decreases relatively slowly. When the threshold voltage Vt is equal to or greater than the voltage VL1 and less than the voltage VH (VL1≤Vt<VH), the memory cell transistor MT is in a much weaker on-state, and the voltage of the node SEN decreases more slowly. When the threshold voltage Vt is equal to or greater than the voltage VH (Vt≥VH), the memory cell transistor MT is in an off-state, and the voltage of the node SEN hardly decreases.

On the basis of this relationship, the sense period is set so that the memory cell transistor MT having the threshold voltage Vt less than the target level is determined to have failed the verify operation, that is, the sense transistor 47 is turned off. More specifically, the first sense period Ts_L2 is set so that the memory cell transistor MT having the threshold voltage Vt less than the voltage VL2 is determined to have failed the first verify operation. Similarly, the first sense period Ts_L1 is set so that the memory cell transistor MT having the voltage Vt less than the voltage VL1 is determined to have failed the first verify operation. The second sense period Ts_H is set so that the memory cell transistor MT having the voltage Vt less than the voltage VH is determined to have failed the second verify operation. Thus, the lengths of the first sense periods Ts_L1 and Ts_L2 and the second sense period Ts_H have a relationship of Ts_L2<Ts_L1<Ts_H.

1.3.2 Overall Flow of Write Operation in Memory System

Next, the overall flow of the write operation in the memory system is described with reference to FIG. 9.

Figure 9:
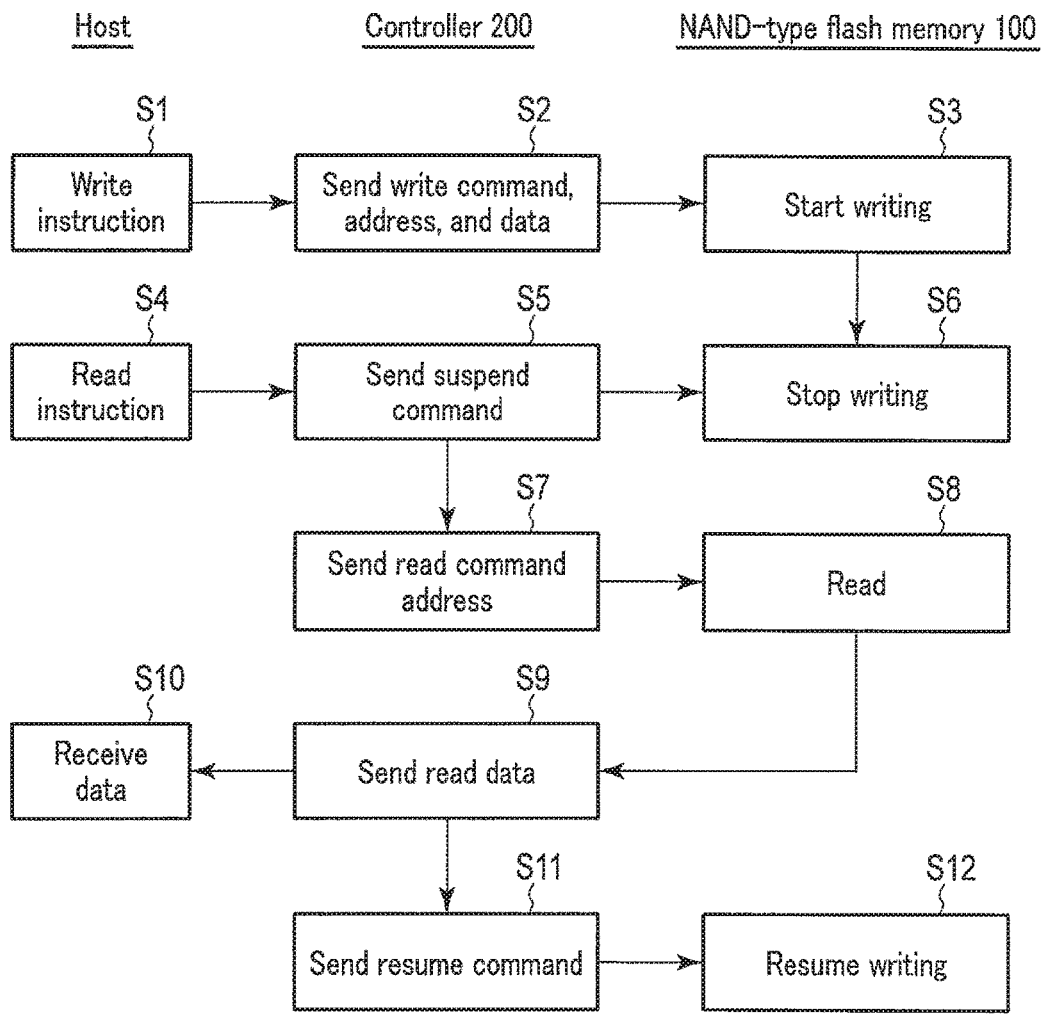
FIG. 9 is a flowchart showing a write operation in the memory system comprising the semiconductor memory device according to the first embodiment.

As shown in FIG. 9, the host interface circuit 210 of the controller 200 receives a write instruction from the host device 2 (step S1).

In response to this write instruction, the processor 230 of the controller 200 sends a write instruction (a write command, addresses, and data) to the NAND-type flash memory 100 via the NAND interface circuit 250.

Then the sequencer 10 of the NAND-type flash memory 100 performs a write operation based on the write instruction received from the controller 200 (step S3).

The controller 200 receives, for example, a read instruction from the host device 2 while the NAND-type flash memory 100 is performing the write operation (step S4). Then the processor 230 sends a suspend command to the NAND-type flash memory 100 (step S5).

The sequencer 10 suspends the write operation based on the received suspend command (step S6). In this instance, the sequencer 10 saves suspend information in, for example, the register 12. The sequencer 10 may also send the suspend information to the controller 200. The sequencer 10 brings the ready/busy signal R/Bn to the "H" level.

The processor 230 then sends a read instruction (a read command and addresses) to the NAND-type flash memory 100 when confirming that the ready/busy signal R/Bn has returned to the "H" level (step S7).

Based on the received read instruction, the sequencer 10 reads data from the memory cell array 13, and sends the result to the controller 200 (step S8).

After performing the ECC processing or the like of the read data, the processor 230 then sends the data to the host device 2 (step S9). The host device 2 receives the read data (step S10).

After the completion of the read operation, the processor 230 sends a resume command to the NAND-type flash memory 100 (step S11).

Based on the received resume command, the sequencer 10 resumes the write operation (step S12). More specifically, the sequencer 10 confirms the suspend information in the register 12, and resumes the write operation.

1.3.3 Overall Flow of Write Operation in NAND-Type Flash Memory

Next, the overall flow of the write operation in the NAND-type flash memory 100 is described with reference to FIG. 10 and FIG. 11. The NAND-type flash memory 100 according to the present embodiment suspends the write operation after the end of the program operation in response to the suspend command during the write operation, and resumes the write operation from the verify operation after receiving the resume command. The example in FIG. 10 and FIG. 11 shows the case where the first and second verify operations are performed for one level (e.g. the "A" level) for the simplification of explanation.

Figure 10:
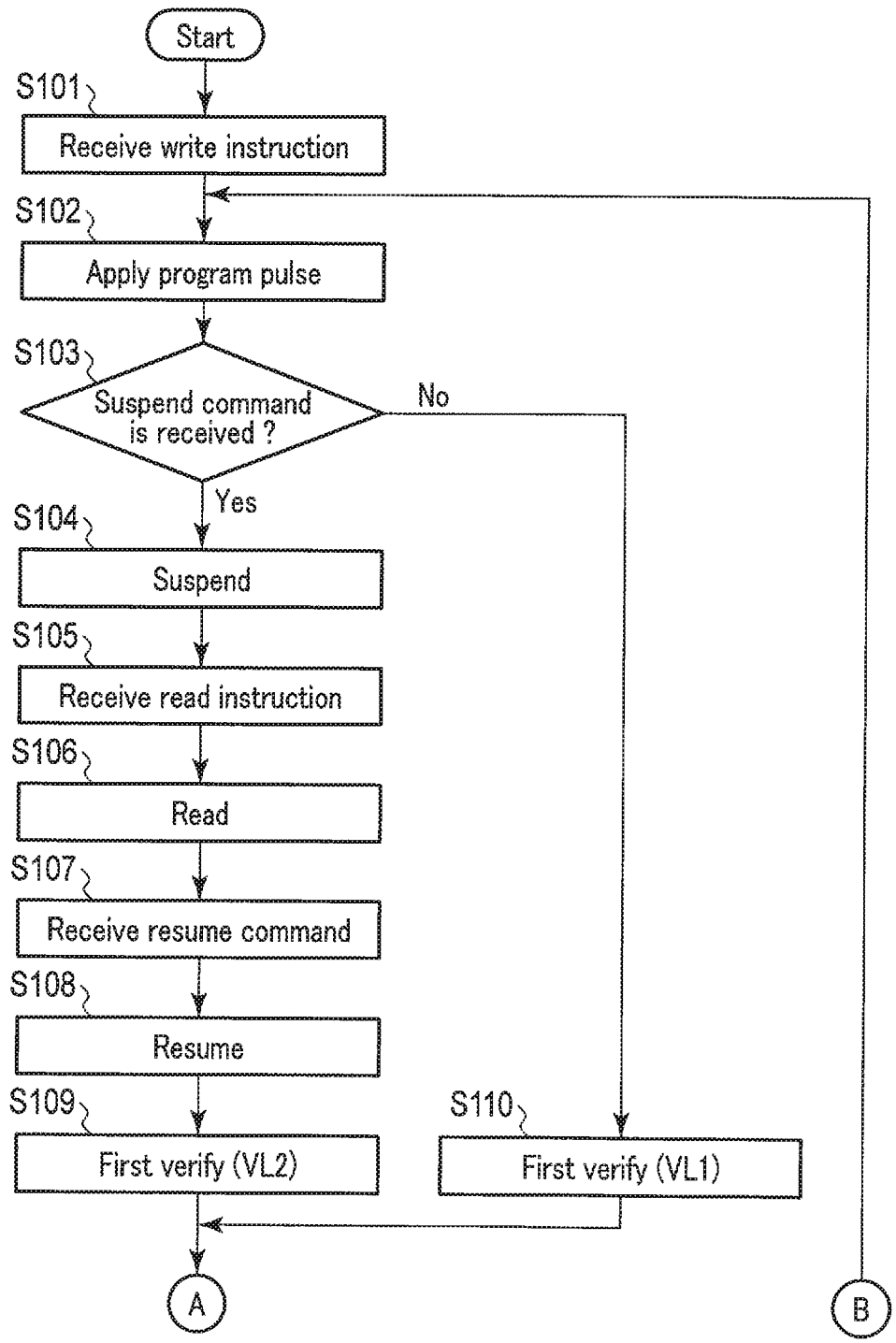
FIGS. 10 and 11 are flowcharts showing the write operation in the semiconductor memory device according to the first embodiment.
Figure 11:
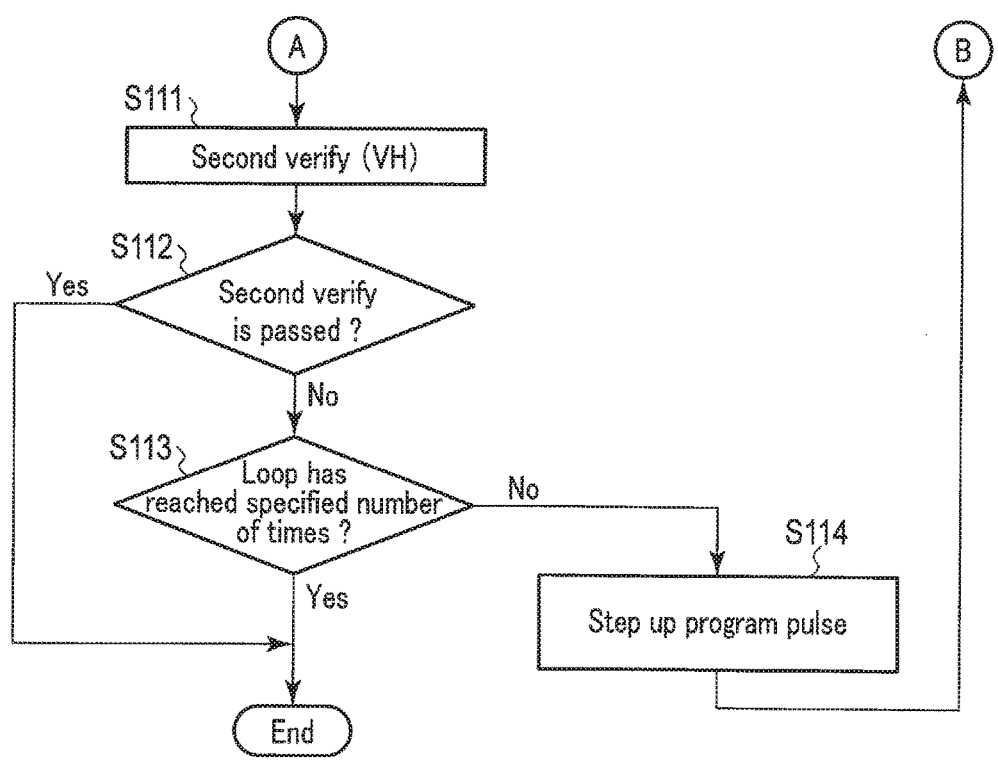

As shown in FIG. 10, the NAND-type flash memory 100 receives a write instruction (a write command, addresses, and program data) from the controller 200 (step S101). The sequencer 10 starts a write operation on the basis of the write instruction received from the controller 200.

First, the sequencer 10 executes the program operation. In the program operation, the row decoder 14 applies a program pulse to the selected word line WL (step S102). More specifically, when starting the program operation, the sequencer 10 brings the ready/busy signal R/Bn to the "L" level. The sense amplifier 15 charges the bit lines BL (hereinafter referred to as "BL precharge") in accordance with the data held by the latch circuits SDL. In the first program operation, the second program condition is not applied, so that the voltage VSS is applied to the bit line BL("0") (grounded) in accordance with the "0" data, that is, the "0" program, and the voltage VBL is applied to the bit line BL("1") in accordance with the "1" data, that is, the "1" program. In the selected block BLK, the row decoder 14 selects one of the word lines WL, applies a voltage VPGM to the selected word line WL as a program pulse, and applies the voltage VPASS to the other unselected word lines WL. The voltage VPGM is a high voltage to charge the charge storage layer with electrons. The voltage VPASS is a voltage which turns on the memory cell transistor MT regardless of the threshold voltage of the memory cell transistor MT. The voltage VPGM and the voltage VPASS have a relationship of VPGM>VPASS. Accordingly, "1" or "0" is written into the target memory cell transistor MT.

When the sequencer 10 has received the suspend command from the controller 200 (step S103_Yes), the sequencer 10 suspends the write operation after the end of the program operation (step S104). After suspending the write operation, the sequencer 10 brings the ready/busy signal R/Bn to the "H" level.

Next, the NAND-type flash memory 100 receives a read instruction (a read command and addresses) from the controller 200 (step S105).

The sense amplifier 15 reads data from the memory cell array 13 (step S106). More specifically, the sequencer 10 brings the ready/busy signal R/Bn to the "L" level when starting the read operation. The row decoder 14 applies a read voltage VCGRV to the selected word line WL of the selected block BLK, and applies the voltage VREAD to the unselected word lines WL. The voltage VCGRV is a voltage corresponding to the threshold level of read target data. The voltage VREAD is a voltage which turns on the memory cell transistor MT regardless of the held data, and has a relationship of VREAD>VCGRV. For example, the memory cell transistor MT is in an off-state when the threshold voltage of the read target memory cell transistor MT is higher than the voltage VCGRV, whereas the memory cell transistor MT is in an on-state when the threshold voltage is lower than the voltage VCGRV. In this state, the sense amplifier 15 senses an electric current flowing through each of the bit lines BL, and then reads data in the memory cell transistor MT. After the end of the read operation, the sequencer 10 brings the ready/busy signal R/Bn to the "H" level.

Then the NAND-type flash memory 100 receives a resume command from the controller 200 (step S107). More specifically, having read the read data, the controller 200 sends the resume command to the NAND-type flash memory 100.

In response to the resume command, the sequencer 10 confirms the suspend information held in the register 12, and resumes the write operation (step S108).

After the resumption, the sequencer 10 first performs the first verify operation (step S109). More specifically, because the state is immediately after resumption, the sequencer 10 brings the target level to the voltage VL2, that is, sets the first sense period Ts_L2 to perform the first verify operation.

Furthermore, when the sequencer 10 has not received the suspend command from the controller 200 (step S103_No), the sequencer 10 brings the target level to the voltage VL1, that is, sets the first sense period Ts_L1 after the end of the program operation (step S102), to perform the first verify operation (step S110).

As shown in FIG. 11, after the end of the first verify operation (step S109 or S110), the sequencer 10 performs the second verify operation (step S111).

When all the memory cell transistors MT (or a preset specified number of memory cell transistors MT or more) of the program target have passed the second verify operation (step S112_Yes), the sequencer 10 ends the write operation.

When there are memory cell transistors MT that have not passed the second verify operation (or there are memory cell transistors MT equal to or greater than the preset specified number) (step S112_No), the sequencer 10 confirms whether or not the program loop has reached a preset specified number of times (step S113).

When the program loop has reached the preset specified number of times (step S113_Yes), the sequencer 10 ends the write operation, and notifies the controller 200 of the fact that the write operation has not ended normally.

When the program loop has not reached the preset specified number of times (step S113_No), the sequencer 10 steps up a set voltage of the program pulse of the next program operation (step S114). More specifically, the sequencer 10 steps up the set voltage of the program pulse by $\Delta V$. The set voltage of the program pulse is stepped up by $\Delta V$ every time the program loop is repeated. For example, if the voltage of the first program pulse is the voltage VPGM, the voltage of the second program pulse is VPGM+$\Delta V$, and the voltage of the third program pulse is VPGM+2$\Delta V$.

Returning to step S102, the next program loop is performed. In this instance, the sense amplifier 15 applies the voltage VBL to the bit line BL("1") corresponding to the memory cell transistor MT that has passed the second verify operation, applies the voltage VSS to the bit line BL("0") corresponding to the memory cell transistor MT that has failed the first verify operation, and applies the voltage VQPW to the bit line BL("QPW") corresponding to the memory cell transistor MT that has passed the first verify operation and failed the second verify operation. The row decoder 14 applies the stepped-up program pulse to the selected word line WL.

The sequencer 10 repeats the program loop until the second verify operation is passed or until the program loop reaches the specified number of times.

1.3.4 Voltage of Each Interconnect in Program Operation

Next, the voltage of each interconnect in the program operation is described with reference to FIG. 12.

Figure 12:
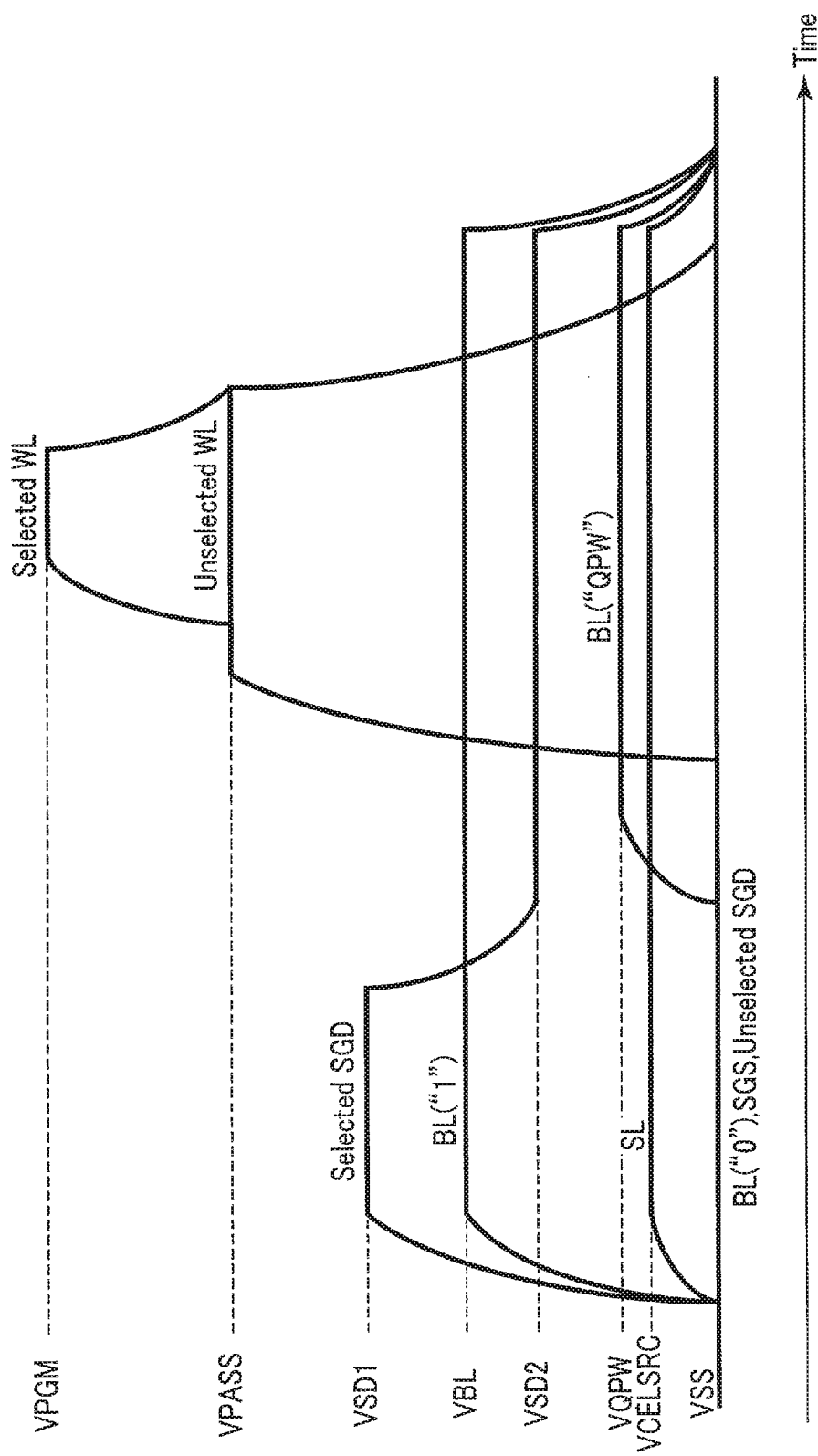
FIG. 12 is a timing chart showing a voltage in each interconnect during a program operation in the semiconductor memory device according to the first embodiment.

As shown in FIG. 12, the sense amplifier 15 performs the BL precharge based on the data stored in the latch circuit SDL in the sense amplifier unit SAU. More specifically, when the "1" data (the "H" level data) is held in the latch circuit SDL, the node INV_S comes into the "L" level, and the transistor 51 therefore turns on. In this state, the signals BLS and BLX are brought to the "H" level, and the transistors 40 and 42 are thus turned on. Thus, if the signal BLC brought to the "H" level and then a voltage "VBL+Vt41 (Vt41 is a threshold voltage of the transistor 41) is applied to the gate of the transistor 41, the voltage VBL is applied to the bit line BL. That is, the voltage VBL is applied to the bit line BL("1"). On the other hand, when the "0" data (the "L" level data) is held in the latch circuit SDL, the node INV_S comes into the "H" level, and the transistor 43 therefore turns on. When the voltage VSS is applied to the node SRCGND, the voltage VSS is applied to the corresponding bit line BL. That is, the voltage VSS is applied to the bit line BL("0") and the bit line BL("QPW").

The row decoder 14 selects one of the blocks BLK, and further selects one of the string units SU. Then the row decoder 14 applies a voltage VSD1 to the select gate line SGD in the selected string unit SU. The voltage VSD1 is a voltage which turns on the select transistor ST1 at a voltage equal to or greater than "VBL+Vtsg" wherein Vtsg is the threshold voltage of the select transistor ST1. On the other hand, the row decoder 14 applies the voltage VSS to the select gate line SGD of the unselected string unit SU to turn off the corresponding select transistor ST1. The row decoder 14 also applies the voltage VSS to the select gate line SGS to turn off the select transistor ST2.

Furthermore, a voltage VCELSRC (>VSS) is applied to the source line SL via, for example, a source line driver (not shown).

Accordingly, the voltage VBL is applied to the channel of the NAND string 16 corresponding to the bit line BL("1"), and the voltage VSS is applied to the channels of the selected NAND strings 16 corresponding to the bit lines BL("0") and BL("QPW").

Thereafter, the row decoder 14 applies a voltage VSD2 to the select gate line SGD of the selected string unit SU. The voltage VSD2 is a voltage that turns on the select transistor ST1 to which the voltage VSS is applied, but cuts off the select transistor ST1 to which the voltage VBL is applied, at a voltage lower than the voltage VSD1 and the voltage VBL. Accordingly, the channel of the NAND string 16 corresponding to the bit line BL("1") becomes a floating state. Also, the sense amplifier 15 brings the "H" level voltage of the signal BLC to "VQPW+Vt41" in the transistor 41 in the sense amplifier unit SAU. Accordingly, in the sense amplifier unit SAU corresponding to the bit line BL("1") to which the voltage VBL is applied, the transistor 41 is cut off, and the bit line BL("1") also becomes a floating state.

Next, the sense amplifier 15 updates the data in the latch circuit SDL in accordance with the second program condition. More specifically, in the sense amplifier unit SAU corresponding to the bit line BL("QPW"), the data in the latch circuit SDL is updated to the "1" data from the "0" data. Therefore, the sense amplifier 15 applies the voltage VQPW clamped by the transistor 41 to the bit line BL("QPW").

The row decoder 14 then selects one of the word lines WL in the selected block BLK, applies the voltage VPGM to the selected word line, and applies the voltage VPASS to the other unselected word lines WL.

In the NAND string 16 corresponding to the bit line BL("0"), the select transistor ST1 becomes an on-state. Then the channel potential of the memory cell transistor MT coupled to the selected word line WL becomes VSS. Thus, a potential difference (VPGM-VSS) between the control gate and the channel increases, and as a result, the charge storage layer is charged with electrons, and the threshold voltage of the memory cell transistor MT is increased.

In the NAND string 16 corresponding to the bit line BL("1"), the select transistor ST1 becomes a cut-off state. Thus, the channel of the memory cell transistor MT coupled to the selected word line WL becomes electrically floating. Accordingly, the channel potential increases due to capacitive coupling with the word line WL. Thus, the potential difference between the control gate and the channel decreases, and as a result, the charge storage layer is hardly charged with electrons, and the threshold voltage of the memory cell transistor MT is maintained (the threshold voltage does not fluctuate as much as the threshold distribution level shifts to a higher distribution).

In the NAND string 16 corresponding to the bit line BL("QPW"), the select transistor ST1 becomes an on-off state. Then the channel potential of the memory cell transistor MT coupled to the selected word line WL becomes VQPW (>VSS). Thus, the potential difference (VPGM-VQPW) between the control gate and the channel is smaller than when the channel potential is VSS. As a result, the amount of electrons with which the charge storage layer is charged becomes smaller than that in the memory cell transistor MT corresponding to the bit line BL("0"), and the fluctuation amount of the threshold voltage of the read target memory cell transistor MT also becomes smaller.

1.3.5 Voltage of Each Interconnect in Verify Operation

Next, the voltage of each interconnect in the verify operation is described with reference to FIG. 13. The example in FIG. 13 shows the case where the first and second verify operations are performed for one level (e.g. the "A" level) for the simplification of explanation. When the verify operations of more than one level are performed, the voltage VCGRV corresponding to each level is applied (the VCGRV is stepped up in accordance with the level). The example in FIG. 13 also shows the case where the BL precharge is performed for all the target bit lines BL in the first verify operation, and in the second verify operation, the BL precharge is performed for the bit line BL which has passed the first verify operation. Although the first sense period is shorter than the second sense period in the case described in the present embodiment, it is not limited to this. For example, the first and second sense periods may have the same length, and the voltage VCGRV at the time of the first and second verify operations may vary depending on the target levels of the first and second verify operations.

As shown in FIG. 13, at a time t1, the row decoder 14 applies a voltage VSG to the select gate lines SGD and SGS of the selected block BLK, applies the voltage VCGRV to the selected word line WL, and applies the voltage VREAD to the unselected word lines WL. The voltage VSG is a voltage which turns on the select transistors ST1 and ST2.

At a time t2, the sense amplifier 15 performs BL precharge of the bit lines BL, and applies a voltage VBLRD to the bit lines BL. The voltage VBLRD is a voltage which is applied to the bit line BL at the time of the read operation.

Furthermore, a voltage VSRC (>VSS) is applied to the source lines SL via, for example, the source line driver.

At a time t3, the sequencer 10 brings the signal HLL to the "H" level to turn on the transistor 45. Accordingly, the voltage VSENP is applied to the node SEN in the sense amplifier unit SAU.

The first verify operation is performed at times t4 to t8.

More specifically, at the time t4, the sequencer 10 brings the signal HLL to the "L" level, and brings the node SEN to a floating state. Then the sequencer 10 applies an "H" level voltage to the clock signal CLK (hereinafter referred to as a "clock-up"). As a result, the transistor 52 is charged with electricity, and the voltage of the node SEN increases to a voltage VBST due to the influence of capacitive coupling. The voltage VBST is a voltage of the node SEN which has been increased by the clock-up, and is a voltage higher than the voltage VSENP.

In a period of the times t5 to t6, the sequencer 10 performs first sensing. The first sense period in the normal state is longer than the first sense period immediately after resumption (the first sense period in the initial first verify operation after a resumption). More specifically, at the times t5 to t6, the sequencer 10 brings the signal XXL to the "H" level to turn on the transistor 44. In this state, when the threshold voltage of the verify target memory cell transistor MT is equal to or greater than the target level, the memory cell transistor MT is turned off (hereinafter referred to as an "off-cell"), and there is almost no electric current flowing to the source line SL from the corresponding bit line BL. Thus, the electric charges stored in the node SEN and the transistor 52 are hardly released, and the voltage of the node SEN hardly fluctuates. On the other hand, when the threshold voltage of the verify target memory cell transistor MT is less than the target level, the memory cell transistor MT is turned on (hereinafter referred to as an "on-cell"), and an electric current flows to the source line SL from the corresponding bit line BL. That is, the voltage of the node SEN decreases.

At the time t6, the sequencer 10 brings the signal XXL to the "L" level to turn off the transistor 44. Then the sequencer 10 applies an "L" level voltage to the clock signal CLK (hereinafter referred to as a "clock-down"). As a result, the voltage of the node SEN decreases due to the influence of capacitive coupling.

In a period of the times t7 to t8, the sequencer 10 strobes the voltage of the node SEN. More specifically, the sequencer 10 brings the signal STB to the "H" level, and turns on the transistor 48. In this state, when the voltage of the node SEN is equal to or greater than the threshold voltage (determination level) of the sense transistor 47, the corresponding sense transistor 47 is turned on. As a result, it is determined that the first verify operation has passed. In this instance, the bus LBUS which has been previously brought to the "H" level is brought to the "L" level.

On the other hand, when the voltage of the node SEN is lower than the threshold voltage (determination level) of the sense transistor 47, the sense transistor 47 is turned off. As a result, it is determined that the first verify operation has failed. In this instance, the bus LBUS which has been previously brought to the "H" level maintains the "H" level.

At the time t8, inverted data in the bus LBUS is stored in the latch circuit SDL. More specifically, "L" data is stored in the latch circuit SDL which has failed the first verify operation, and the node INV_S is brought to the "H" level. Accordingly, the transistor 51 is turned off, and the transistor 43 is turned on. Therefore, the voltage VSS is applied to the bit line BL corresponding to the memory cell transistor MT ("off-cell") which has failed the first verify operation.

At the times t9 to t13, the sequencer 10 performs the second verify operation as in the times t4 to t8. The operation at the times t9 to t13 is almost the same as that at the times t4 to t8. Although the setup of the node SEN (application of the voltage VSENP) is not performed in the second verify operation in the present embodiment, the setup of the node SEN may be performed as in the first verify operation.

At the time t9, the voltage of the node SEN is clocked up.

In a period of the times t10 to t11, the sequencer 10 performs second sensing.

At the time t11, the voltage of the node SEN is clocked down.

In a period of the times t12 to t13, the sequencer 10 strobes the voltage of the node SEN. When the voltage of the node SE is equal to or greater than the threshold voltage of the transistor 47, the corresponding transistor 47 is turned on. As a result, it is determined that the second verify operation has passed. On the other hand, when the voltage of the node SEN is lower than the threshold voltage of the transistor 47, the corresponding transistor 47 is turned off. As a result, it is determined that the second verify operation has failed.

At the time t13, recovery processing is performed, and the verify operation ends.

The times t2 to t13 are repeated at every level when more than one level of the verify operation are performed. In this case, the voltage VCGRV is stepped up in accordance with each level.

1.3.6 Operation of Controller in Write Operation

Next, the operation of the controller 200 at the time of the write operation is described with reference to FIG. 14. The example in FIG. 14 shows the write operation in the normal state.

Figure 14:
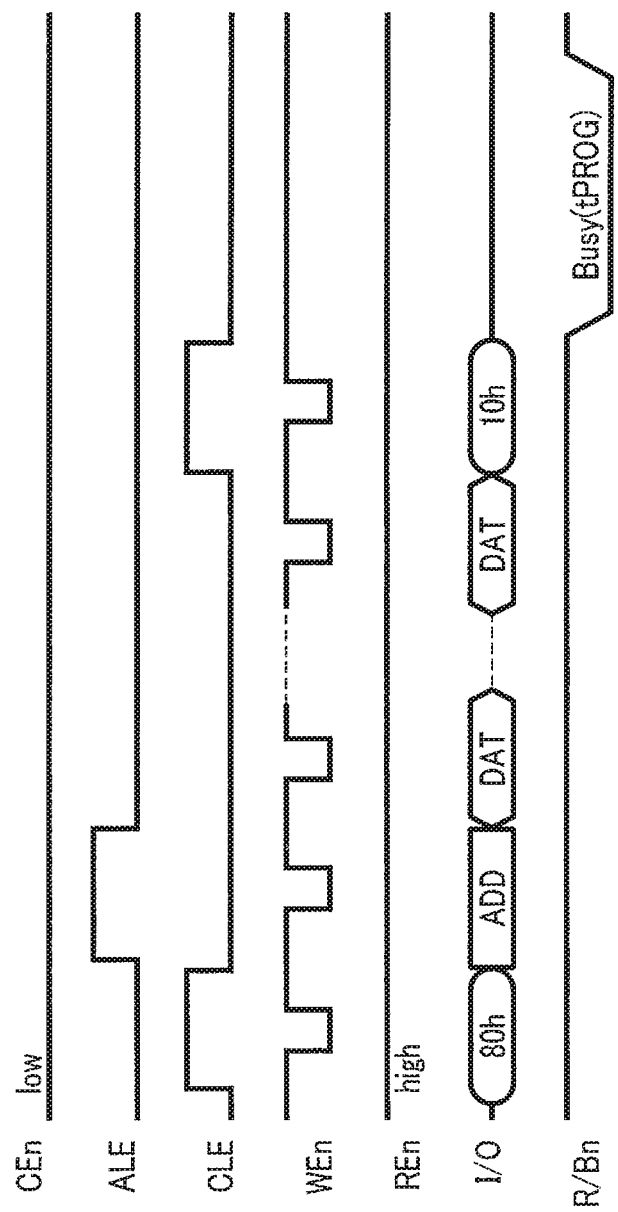
FIG. 14 is a timing chart of various signals during a write operation in the memory system comprising the semiconductor memory device according to the first embodiment.

As shown in FIG. 14, the processor 230 first outputs a command "80h" which notifies that the write operation is performed to the NAND-type flash memory 100, and brings the command latch enable signal CLE to the "H" level to assert the same.

Next, the processor 230 outputs an address "ADD", and brings the address latch enable signal ALE to the "H" level to assert the same. Although the address is indicated in one cycle in the example in FIG. 14, there may be more than one cycle to send a column address, a row address, and others.

The processor 230 then outputs program data "DAT" for a necessary number of cycles.

Furthermore, the processor 230 outputs a write command "10h" which instructs to perform writing, and brings the command latch enable signal CLE to the "H" level to assert the same.

The above commands, addresses, and data are stored in, for example, the register 12 of the NAND-type flash memory 100.

In response to the write command "10h", the NAND-type flash memory 100 starts a write operation, and comes into a busy state (R/Bn="L"). Hereinafter, the write operation period in the NAND-type flash memory 100, that is, the period of the busy state, will be hereinafter mentioned as tPROG.

After the completion of the write operation, the NAND-type flash memory 100 comes into a ready state, and the ready/busy signal R/Bn returns to the "H" level.

1.3.7 Specific Example in the Case where Suspension Occurs During Write Operation Next, a specific example in the case where suspension occurs during the write operation is described with reference to FIG. 15. The example in FIG. 15 shows the case where the write operation is suspended in the first program loop, and resumed after the execution of a read operation. The example in FIG. 15 also shows the case where verify operations at the "A" to "C" levels are performed in one program loop. The voltages VCGRV corresponding to the "A" to "C" levels will be hereinafter mentioned as VCGRV A to VCGRV_C, respectively.

As shown in FIG. 15, the processor 230 outputs the command "80h", the address data "ADD", and the write command "10h" to perform the write operation. Accordingly, the sequencer 10 starts the write operation in response to the write command "10h", and becomes the busy state (R/Bn="L").

When receiving a read instruction from the host device 2 during the write operation, the processor 230 outputs a suspend command "A7h". In the example in FIG. 15, the sequencer 10 receives the suspend command "A7h" during the program operation (during the application of the voltage VPGM to the selected word line WL) of the first program loop (the first program operation). When receiving the suspend command "A7h" regardless of the busy state, the sequencer 10 suspends the write operation after the end of the program operation, and returns the ready/busy signal R/Bn to the "H" level. When receiving the suspend command "A7h" during the verify operation, the sequencer 10 suspends the write operation after the end of the next program operation. The period from the receipt of the suspend command until the ready/busy signal R/Bn is returned to the "H" level, in other words, the period until a suspend state, will be hereinafter mentioned as a period tSTOPRST.

After confirming that the ready/busy signal R/Bn has returned to the "H" level, the processor 230 then outputs a command "00h" to notify that a read operation will be performed, the address "ADD" for reading, and a read command "30h" to instruct to perform a read operation. Although the example in FIG. 15 shows the case where the address is transferred in one cycle, the address may be transferred in more than one cycle.

In response to the read command "30h", the sequencer 10 starts the read operation, and comes into a busy state. The period of the busy state in the read operation will be hereinafter mentioned as a period tR. When the reading of data "R-DAT" from the memory cell array 13 is completed, the ready/busy signal R/Bn returns to the "H" level (comes into a ready state). When the ready/busy signal R/Bn becomes the "H" level, the controller 200 sends the read enable signal REn to the NAND-type flash memory 100, and then reads the data "R-DAT".

After the end of the read operation, the processor 230 then outputs a resume command "48h". In response to the resume command "48h", the sequencer 10 then resumes the write operation from the verify operation, and comes into a busy state after confirming the suspend information. In the example in FIG. 15, the write operation is suspended after the end of the first program operation, so that the write operation is resumed from the first verify operation of the first program loop. In this case, the voltages VL2 are set as the target levels of the first verify operation (the initial first verify operation after resumption) at the "A" to "C" levels, respectively (the first sense periods Ts_L2 are respectively set). Hereinafter, in the verify operation immediately after resumption, the verify periods (corresponding to the periods of the times t1 to t13 in FIG. 13), which are the combinations of the first verify operations and the second verify operations at the "A" to "C" levels, will be periods TA1, TB1, and TC1, respectively. When the second verify operation at one of the "A" to "C" levels is failed after the end of the verify operation at the "C" level, the second program loop is performed. In the second program operation (the program operation of the second program loop), the voltage VPGM+ ΔV is applied to the selected word line WL. In the first verify operation of the second program loop, the voltage VL1 is set as the target level of the first verify operation at the "A" to "C" levels (the first sense periods Ts_L1 are respectively set). Hereinafter, in the verify operations other than the verify operation immediately after resumption, that is, in the normal verify operations including the verify operation before suspension, the verify periods, which are the combinations of the first verify operations and the second verify operations at the "A" to "C" levels, will be periods TA2, TB2, and TC2, respectively.

After the write operation is completed in the NAND-type flash memory 100, the ready/busy signal R/Bn returns to the "H" level.

Next, a specific example of the verify period immediately after resumption and the normal verify period are described with reference to FIG. 16. The example in FIG. 16 is a timing chart showing each of the voltages of the selected word line WL, the signal STB, and the signal XXL in the verify period immediately after resumption (the "A" to "C" levels) and the normal verify period (the "A" to "C" levels) after the second program operation in FIG. 15.

Figure 16:
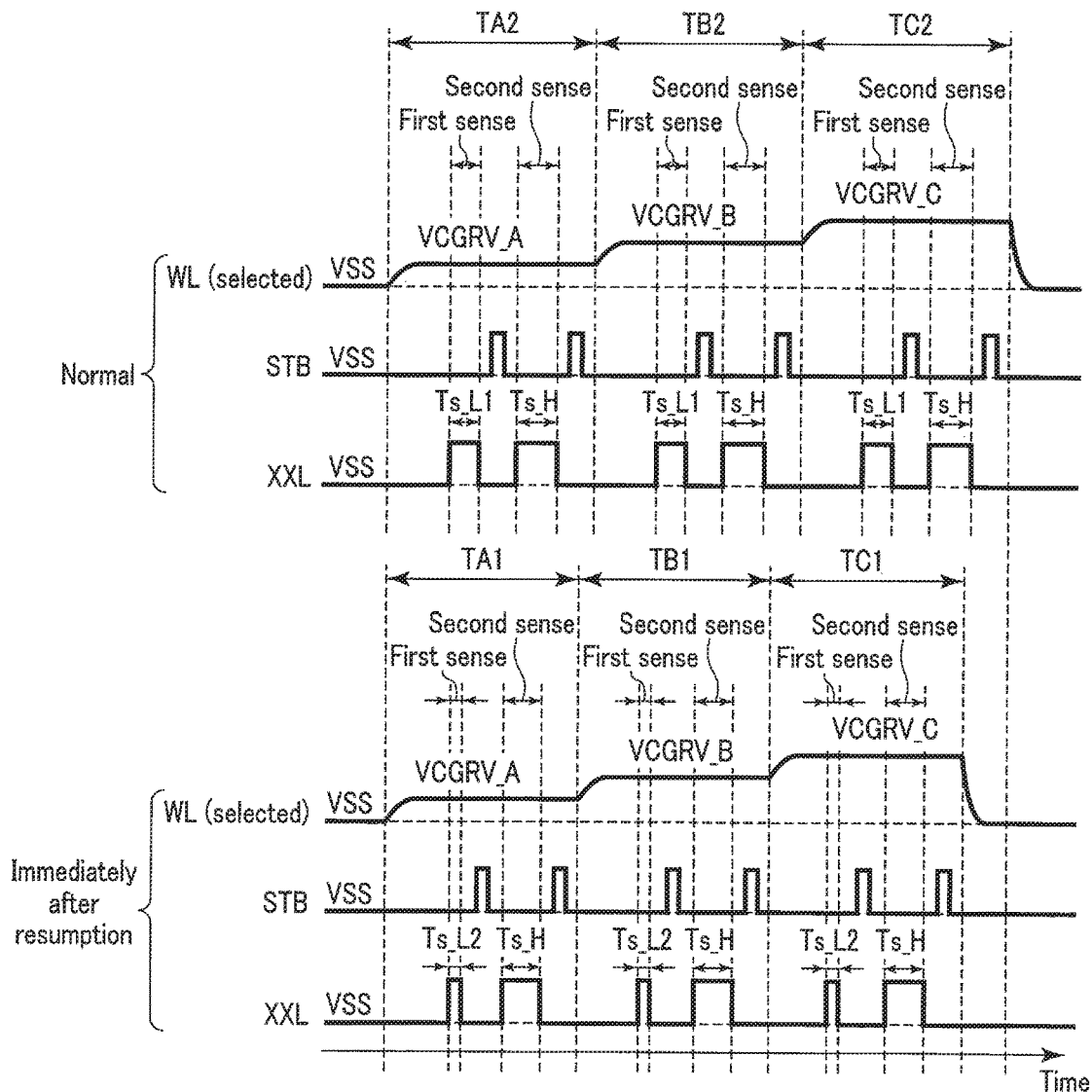
FIG. 16 is a timing chart showing voltages of a selected word line, a signal STB, and a signal XXL in a normal-state verify period and in a verify period immediately after resumption, in the semiconductor memory device according to the first embodiment.

As shown in FIG. 16, in the verify periods TA1, TB1, and TC1 immediately after resumption (lower stage), the Ts_L2 is set as the first sense period. On the other hand, in the normal verify periods TA2, TB2, and TC2 (upper stage), the Ts_L1 is set as the first sense period. In the example in FIG. 16, the second sense period Ts_H and other periods (e.g. a step-up period of the bit line BL or the node SEN) in each verify period are the same. If the verify periods at the "A" to "C" levels are compared to one another, the first sense period immediately after resumption is shorter than the normal first sense period ("Ts_L2"<"Ts_L1"), leading to relations TA1<TA2, TB1<TB2, and TC1<TC2. That is, the verify period at each level immediately after resumption is shorter than the normal verify period.

Although the first sense periods Ts_L2 are set in all of the first verify operations at the "A" to "C" levels performed immediately after resumption in the case described in the present example, the first sense period Ts_L2 may be set for at least one of the "A" to "C" levels, and the first sense periods Ts_L1 may be set for the other levels. In addition, the lengths of the first sense periods Ts_L2 at the respective "A" to "C" levels may be different from one another. Moreover, although the verify operations of all the "A" to "C" levels are performed immediately after resumption in the case described, the verify operation of at least one of the "A" to "C" levels may be performed depending on the situation of data writing into the memory cell transistor MT.

1.4 Advantageous Effects According to the Present Embodiment

The reliability of the semiconductor memory device can be improved in the configuration according to the present embodiment. The present advantageous effects are described below.

Figure 17:
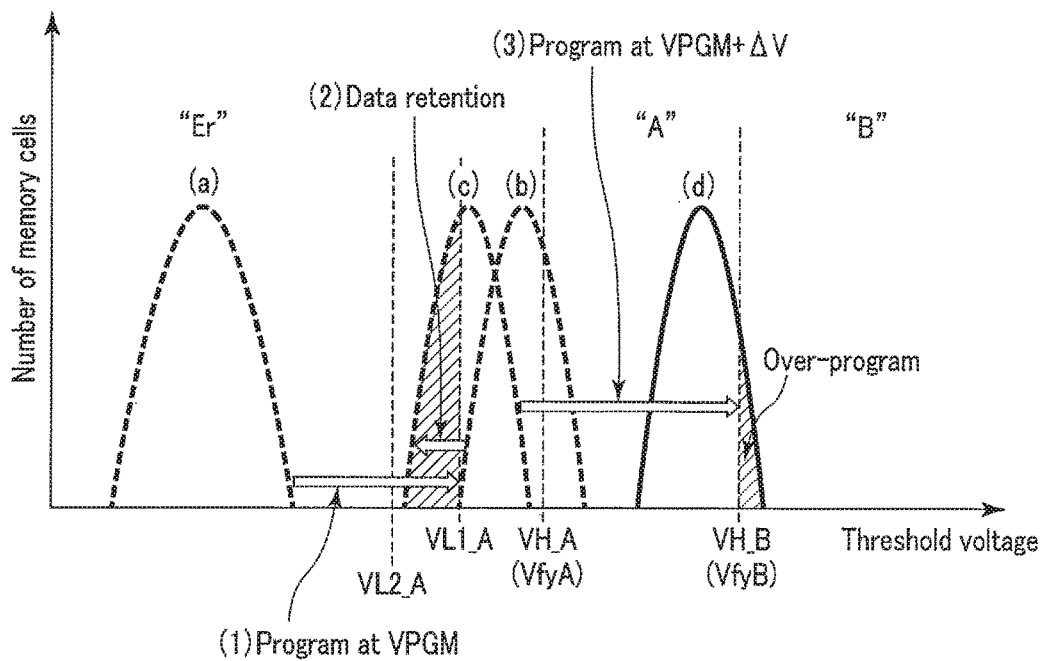
FIG. 17 is a threshold distribution diagram of the memory cell transistor in the case where the write operation is suspended.

If a write operation is suspended, a miswriting operation attributed to over-programming may occur. For example, as shown in FIG. 17, when data is written from the "Er" level to the "A" level, the voltage VPGM is applied to the selected word line WL, and suspension is performed after writing from a threshold distribution (a) to a threshold distribution (b) (the increase of the threshold distribution). Accordingly, during the suspension, data retention in which the memory cell transistor MT is discharged occurs, and the threshold voltage of the memory cell transistor MT decreases from the threshold distribution (b) to a threshold distribution (c). Thus, a part of the threshold voltage of the memory cell transistor MT which has been equal to or greater than the voltage VL1_A decreases to less than the voltage VL1_A at the position of the threshold distribution (b) (a shaded portion of the threshold distribution (c)). Accordingly, the first verify operation immediately after resumption is failed, so that the next program operation is executed under the first program condition for the memory cell transistor MT in the shaded portion of the threshold distribution (c). In this instance, because the voltage VPGM+ΔV that has been stepped up from the voltage VPGM before the suspension is applied to the selected word line WL, the threshold voltage of the memory cell transistor MT in the shaded portion of the threshold distribution (c) rises significantly. Therefore, a miswriting attributed to over-programming occurs in some of the memory cell transistors MT (a shaded portion of a threshold distribution (d)).

In contrast, in the configuration according to the present embodiment, when the write operation is suspended, the target level of the first verify operation immediately after resumption that is lower than the target level of the first verify operation in the normal state can be set. For example, in FIG. 17, the voltage VL2_A lower than the shaded portion of the threshold distribution (d) is set. Thus, in the first verify operation immediately after resumption, the number of the memory cell transistors MT that fail the first verify operation due to the influence of the threshold voltage decrease attributed to data retention can be reduced. Consequently, when the write operation is suspended, over-programming attributed to the program operation immediately after resumption can be suppressed, and miswriting can be reduced. Therefore, the reliability of the semiconductor memory device can be improved.

2. Second Embodiment

Next, a semiconductor memory device according to a second embodiment is described. In the case described in the second embodiment, a write operation is suspended after the end of a verify operation, and the write operation is resumed from the verify operation. The operation of the controller 200 in the second embodiment is the same as that in the first embodiment. Only the differences between the present embodiment and the first embodiment are described below.

2.1 Target Levels of Verify Operations

Next, the target level of the verify operation is described. As in the first embodiment, the target level of the first verify operation immediately after resumption may be lower than the target level in the normal state. Also, the target level of the first verify operation immediately after resumption may be set at the same voltage VL1 as the target level of the first verify operation in the normal state. That is, the first sense period in the verify operation before suspension may have the same length as the first sense period in the verify operation immediately after resumption. In the case described below in the present embodiment, the target level of the first verify operation immediately after resumption is at the same voltage VL1 as the target level of the first verify operation in the normal state.

2.2 Overall Flow of Write Operation in NAND-Type Flash Memory

Figure 18:
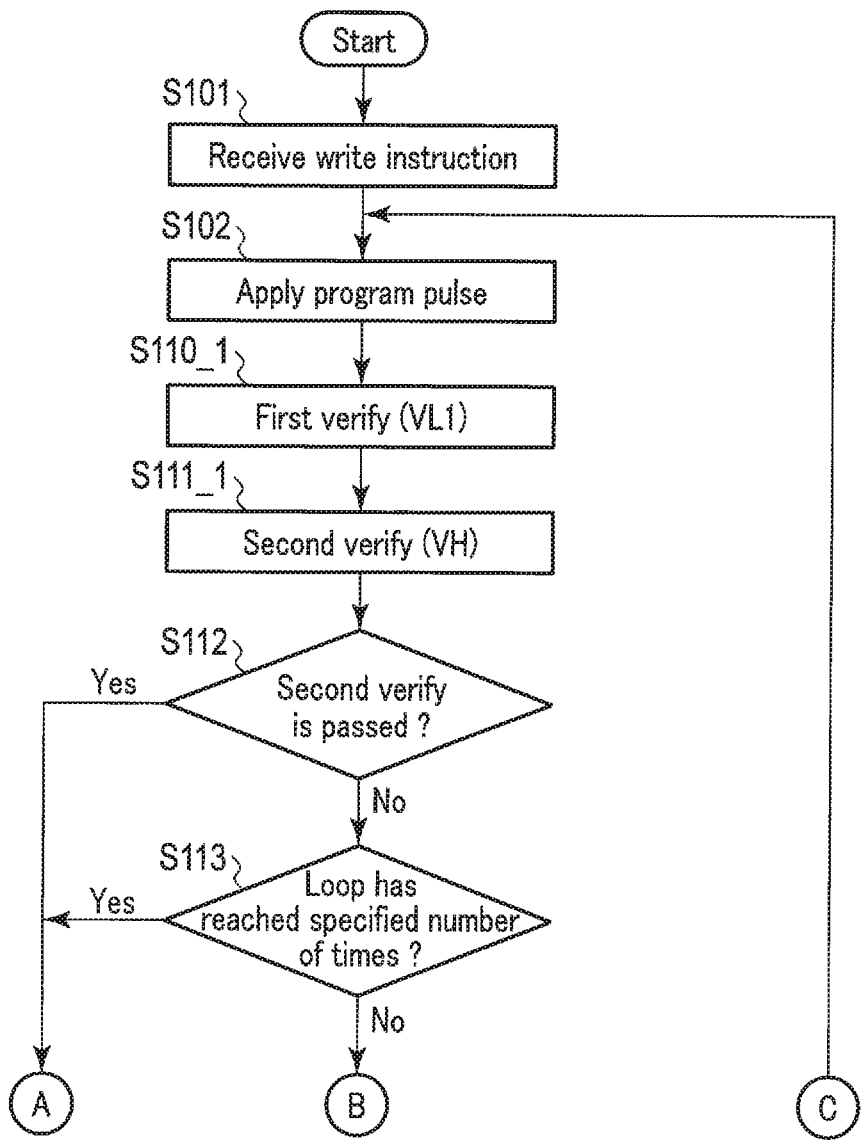
FIGS. 18 and 19 are flowcharts showing a write operation in a semiconductor memory device according to a second embodiment.
Figure 19:
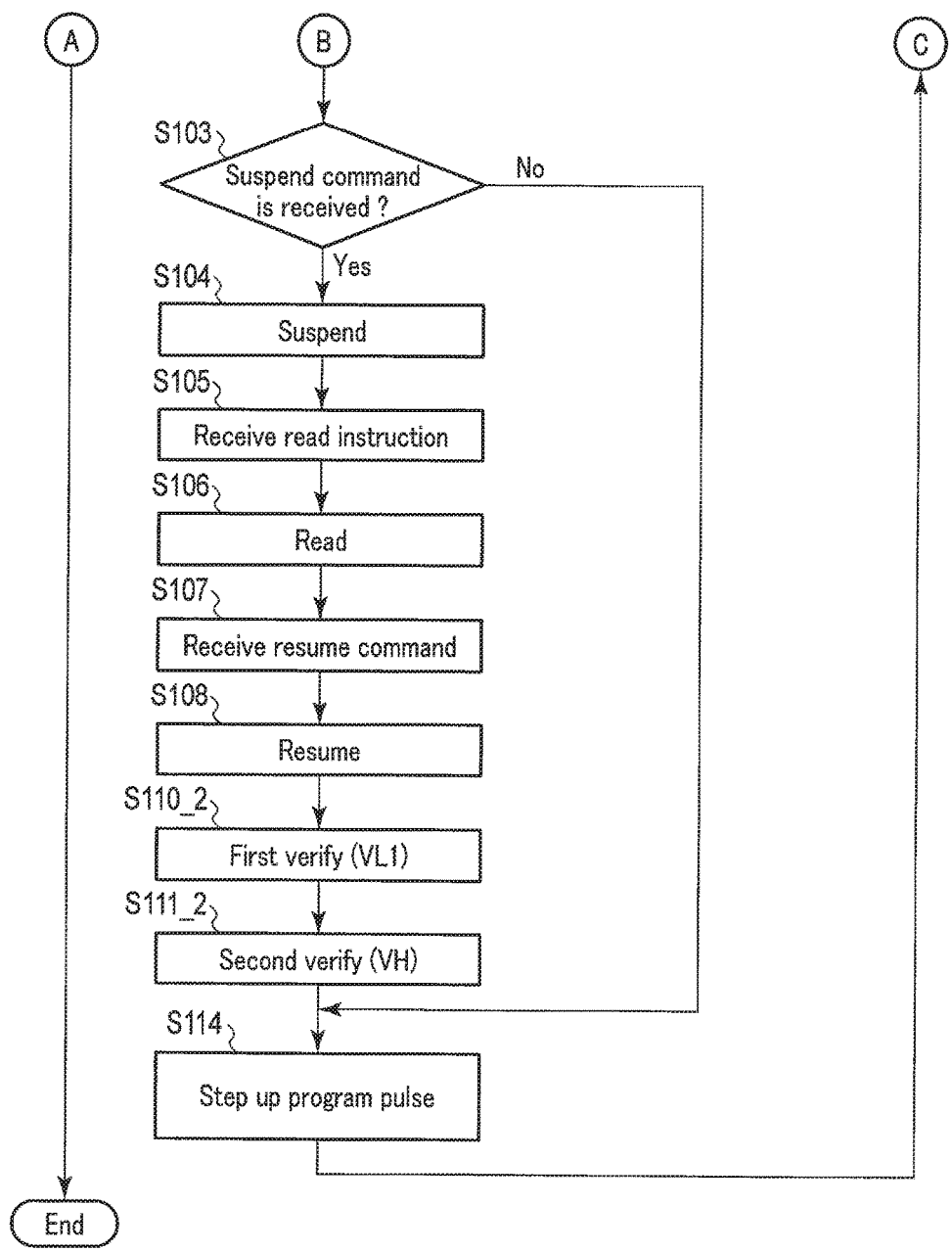

First, the overall flow of the write operation in the NAND-type flash memory 100 is described with reference to FIG. 18 and FIG. 19. The example shown in FIG. 18 and FIG. 19 shows the case where the first and second verify operations are performed for one level (e.g. the "A" level) for the simplification of explanation, as in FIG. 10 and FIG. 11 according to the first embodiment. Steps S101 to 108 and S112 to S114 in FIG. 18 and FIG. 19 are the same as those in FIG. 10 and FIG. 11 according to the first embodiment. Similarly, steps S110_1 and S110_2 in FIG. 18 and FIG. 19 are the same as step S110 according to the first embodiment, and steps S111_1 and S111_2 are the same as step S111 according to the first embodiment. Thus, the operations in steps S101 to 108, S110_1, S110_2, S111_1, S111_2, and S112 to S114 are not described in detail.

As shown in FIG. 18, the NAND-type flash memory 100 first receives a write instruction from the controller 200 (step S101).

Then the row decoder 14 applies a program pulse to a selected word line WL (step S102). That is, the sequencer 10 executes a program operation.

Next, the sequencer 10 performs verify operations. More specifically, the sequencer 10 performs a first verify operation based on the target level VL1 (step S110_1), and a second verify operation based on a target level VH2 (step S111_1).

When all the memory cell transistors MT (or a preset specified number of memory cell transistors MT or more) of the program target have passed the second verify operation (step S112_Yes), the sequencer 10 ends the write operation.

When there are memory cell transistors MT which have not passed the second verify operation (or there are memory cell transistors MT equal to or greater than the preset specified number) (step S112_No), the sequencer 10 confirms whether or not the program loop has reached a preset specified number of times (step S113).

When the program loop has reached the preset specified number of times (step S113_Yes), the sequencer 10 ends the write operation, and notifies the controller 200 of the fact that the write operation has not ended normally.

When the program loop has not reached the preset specified number of times (step S113_No), the sequencer 10 confirms whether or not a suspend command is received from the controller 200 as shown in FIG. 19 (step S103).

When the sequencer 10 has received the suspend command from the controller 200 (step S103_Yes), the sequencer 10 suspends the write operation after the end of the verify operation (step S104). After suspending the write operation, the sequencer 10 brings the ready/busy signal R/Bn to the "H" level.

Next, the NAND-type flash memory 100 receives a read instruction from the controller 200 (step S105), and performs a read operation (step S106). After the end of the read operation, the sequencer 10 brings the ready/busy signal R/Bn to the "H" level.

The NAND-type flash memory 100 then receives a resume command from the controller 200 (step S107).

In response to the resume command, the sequencer 10 confirms the suspend information in the register 12, and resumes the write operation (step S108).

After the resumption, the sequencer 10 again performs the verify operations. More specifically, the sequencer 10 performs the first verify operation (step S110_2) and the second verify operation (step S111_2). The first verify operation (step S110_2) and the second verify operation (step S111_2) may be omitted.

When the sequencer 10 has not received the suspend command from the controller 200 (step S103_No), or after the execution of the second verify operation (step S111_2), the sequencer 10 steps up the set voltage of the program pulse of the next program operation (step S114).

Returning to step S102, the next program loop is performed. In this instance, the sense amplifier 15 applies the voltage preferentially using the results of the first verify operation (step S110_1) and the second verify operation (step S111_1) performed immediately before resumption.

The sequencer 10 repeats the program loop until the second verify operation (step S111_1) is passed, or until the program loop reaches the specified number of times.

2.3 Specific Example in the Case where Suspension Occurs During Write Operation

Next, a specific example in the case where suspension occurs during the write operation is described with reference to FIG. 20. The example in FIG. 20 shows the case where the write operation is suspended in the first program loop, and resumed after the execution of a read operation, as in FIG. 15 according to the first embodiment. The example in FIG. 20 also shows the case where verify operations at the "A" to "C" levels are performed in one program loop.

As shown in FIG. 20, in contrast to the first embodiment, when receiving the suspend command "A7h", for example, during the program operation (during the application of the voltage VPGM to the selected word line WL), the sequencer 10 suspends the write operation after the end of the verify operations at the "A" to "C" levels, and returns the ready/busy signal R/Bn to the "H" level. In this instance, the verify periods that are the combinations of the first verify operations and the second verify operations at the "A" to "C" levels are periods tA2, tB2, and tC2, respectively. Therefore, the period tSTOPRST in the present embodiment is longer than the period tSTOPRST in the first embodiment by the execution of the verify operations.

After the resumption, the sequencer 10 resumes the write operation from the verify operation, and comes into the busy state after confirming the status at the time of the suspension of the write operation, as in the first embodiment. However, the verify result before suspension is preferentially used for the verify determination.

2.4 Advantageous Effects According to the Present Embodiment

In the configuration according to the present embodiment, when the write operation is suspended, the suspension is performed after the end of the verify operations, and the verify operation is again performed immediately after resumption. The verify operation is performed before suspension, so that the influence of data retention can be suppressed. Consequently, over-programming attributed to the program operation after resumption can be suppressed, and miswriting can be reduced. Therefore, the reliability of the semiconductor memory device can be improved.

Furthermore, the verify operation is again performed immediately after resumption, so that it is possible to confirm the influence of data retention, and, for example, the influence of disturbance or the like attributed to the read operation performed during suspension.

3. Third Embodiment

Next, a semiconductor memory device according to a third embodiment is described. In the third embodiment, the voltage of the program pulse immediately before suspension (the voltage of the last program pulse before the write operation is suspended) is the same as the voltage of the first program pulse after resumption. The case where the present embodiment is applied to the second embodiment is shown below, and only the differences between the present embodiment and the second embodiment are described below.

3.1 Overall Flow of Write Operation in NAND-Type Flash Memory

Figure 21:
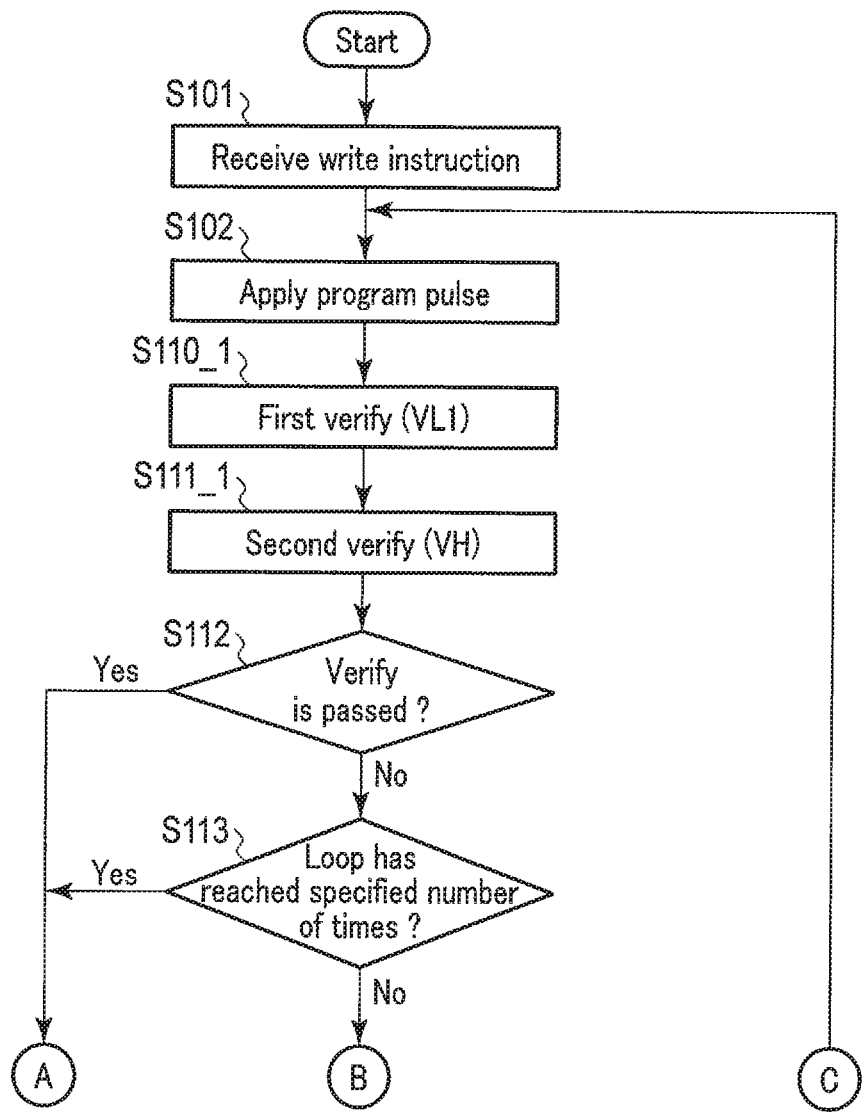
FIGS. 21 and 22 are flowcharts showing a write operation in a semiconductor memory device according to a third embodiment.
Figure 22:
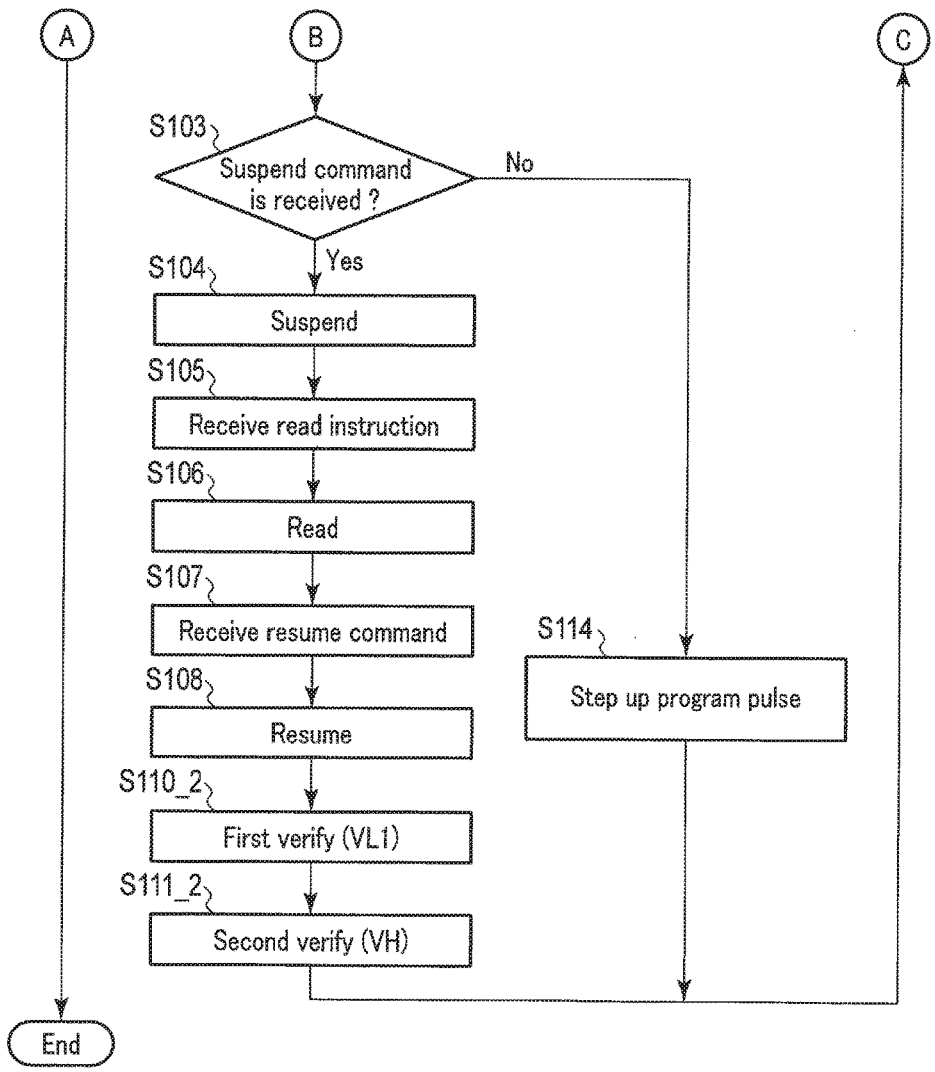

First, the overall flow of the write operation in the NAND-type flash memory 100 is described with reference to FIG. 21 and FIG. 22. The example shown in FIG. 21 and FIG. 22 shows the case where the first and second verify operations are performed for one level (e.g. the "A" level) for the simplification of explanation, as in FIG. 18 and FIG. 19 according to the second embodiment. The operation in each of the steps in FIG. 21 and FIG. 22 is the same as that in FIG. 18 and FIG. 19 according to the second embodiment. Thus, the operation in each step is not described in detail.

As shown in FIG. 21, the flow from the receipt of a write instruction from the controller 200 (step S101) to the execution of the second verify operation after resumption (step S111_2) is similar to that in FIG. 18 and FIG. 19 according to the second embodiment.

The present embodiment is different from the second embodiment in that when the sequencer 10 has not received the suspend command from the controller 200 (step S103_No), the sequencer 10 steps up the set voltage of the program pulse of the next program operation (step S114).

On the other hand, when the second verify operation is performed (step S111_2), the sequencer 10 maintains (does not step up) the set voltage of the program pulse.

Returning to step S102, the next program loop is then performed. In this instance, the sense amplifier 15 applies the voltage to the bit line BL preferentially using the results of the first verify operation (step S110_1) and the second verify operation (step S111_1) performed immediately before resumption.

The sequencer 10 repeats the program loop until the second verify operation (step S111_1) is passed or until the program loop reaches the specified number of times.

3.2 Specific Example in the Case where Suspension Occurs During Write Operation

Next, a specific example in the case where suspension occurs during the write operation is described with reference to FIG. 23. The example in FIG. 23 shows the case where the write operation is suspended in the first program loop, and resumed after the execution of a read operation, as in FIG. 20 according to the second embodiment. The example in FIG. 23 also shows the case where verify operations at the "A" to "C" levels are performed in one program loop.

As shown in FIG. 23, the voltage of the program pulse after resumption is different from that in FIG. 20 according to the second embodiment. More specifically, the sequencer 10 again performs the verify operation of the first program loop after resumption. Thereafter the row decoder 14 applies the same voltage VPGM as that in the first program operation to a selected word line WL in the second program operation. The row decoder 14 then applies the stepped-up voltage VPGM+ΔV to the selected word line WL in the third program operation (the program of the third program loop).

3.3 Advantageous Effects According to the Present Embodiment

In the configuration according to the present embodiment, when the write operation is suspended, the voltage of the last program pulse before suspension can be the same as the voltage of the first program pulse after resumption. Consequently, over-programming attributed to the program operation after resumption can be suppressed, and miswriting can be reduced. Therefore, the reliability of the semiconductor memory device can be improved.

Furthermore, the present embodiment can be applied to the first and second embodiments. Thus, advantageous effects similar to those in the first and second embodiments can be obtained.

4. Fourth Embodiment

Next, a semiconductor memory device according to a fourth embodiment is described. In the case described in the fourth embodiment, a write operation is suspended in the middle of a verify operation, and the write operation is resumed from the verify operation. The operation of the controller 200 in the fourth embodiment is the same as that in the first embodiment. Only the differences between the present embodiment and the first to third embodiments are described below.

4.1 Overall Flow of Write Operation in NAND-Type Flash Memory

Figure 24:
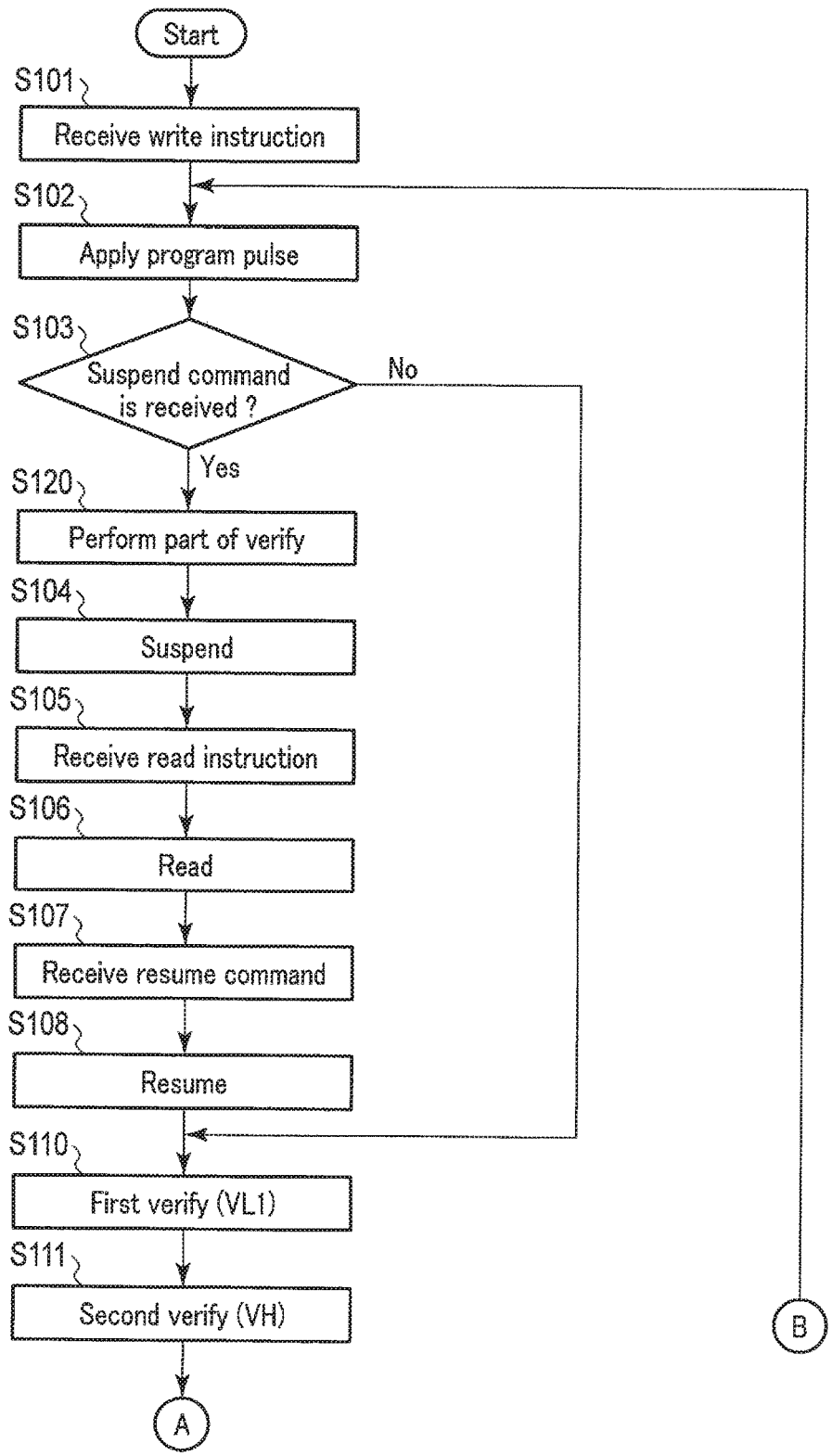
FIGS. 24 and 25 are flowcharts showing a write operation in a semiconductor memory device according to a fourth embodiment.
Figure 25:
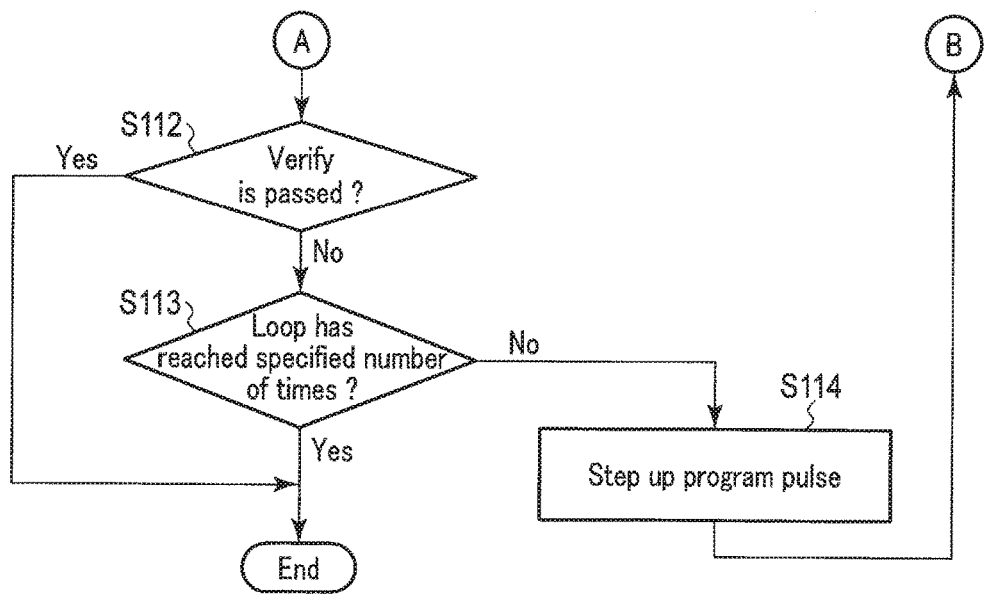

First, the overall flow of the write operation in the NAND-type flash memory 100 is described with reference to FIG. 24 and FIG. 25. The example shown in FIG. 24 and FIG. 25 shows the case where the first and second verify operations are performed for one level (e.g. the "A" level) for the simplification of explanation, as in FIG. 10 and FIG. 11 according to the first embodiment. The example also shows the case where the target level of the first verify operation immediately after resumption is at the same voltage VL1 as the target level of the first verify operation in the normal state, as in the case shown in the second and third embodiments. Steps S101 to S108 and S110 to S114 in FIG. 24 and FIG. 25 are the same as those in FIG. 10 and FIG. 11 according to the first embodiment. Thus, the operations in steps S101 to S108 and S110 to S114 are not described in detail.

As shown in FIG. 24, the NAND-type flash memory 100 first receives a write instruction from the controller 200 (step S101).

Then the row decoder 14 applies a program pulse to a selected word line WL (step S102). That is, the sequencer 10 executes a program operation.

When the sequencer 10 has received the suspend command from the controller 200 (step S103_Yes), the sequencer 10 performs a preset part of the operation of the verify operation (step S120). For example, the sequencer 10 may select and perform the first verify operation which is subject to data retention. Alternatively, for example, the sequencer 10 may select and verify the level (e.g. the "A" level) located in the vicinity of the write level (e.g. writing from the "Er" level to the "A" level), in the verify operations at the "A" to "C" levels.

Thereafter, the sequencer 10 suspends the write operation (step S104).

Next, the NAND-type flash memory 100 receives a read instruction (a read command and addresses) from the controller 200 (step S105), and performs a read operation (step S106).

Then the NAND-type flash memory 100 receives a resume command from the controller 200 (step S107).

In response to the resume command, the sequencer 10 confirms the suspend information in the register 12, and resumes the write operation (step S108).

After the resumption (step S108), or when the sequencer 10 has not received the suspend command from the controller 200 (step S103_No), the sequencer 10 performs the first verify operation (step S110) and the second verify operation (step S111). However, when suspension is performed, the sequencer 10 preferentially uses a determination result based on a partial operation (step S120) of the verify operation performed before suspension.

As shown in FIG. 25, when all the memory cell transistors MT (or a preset specified number of memory cell transistors MT or more) of the program target have passed the second verify operation (step S112_Yes), the sequencer 10 ends the write operation.

When there are memory cell transistors MT which have not passed the second verify operation (or there are memory cell transistors MT equal to or greater than the preset specified number) (step S112_No), the sequencer 10 confirms whether or not the program loop has reached a preset specified number of times (step S113).

When the program loop has reached the preset specified number of times (step S113_Yes), the sequencer 10 ends the write operation, and notifies the controller 200 of the fact that the write operation has not ended normally.

When the program loop has not reached the preset specified number of times (step S113_No), the sequencer 10 steps up the set voltage of the program pulse of the next program operation (step S114).

Returning to step S102, the next program loop is then performed.

The sequencer 10 repeats the program loop until the second verify operation (step S111) is passed, or until the program loop reaches the specified number of times.

4.2 Specific Example in the Case where Suspension Occurs During Write Operation

Next, a specific example in the case where suspension occurs during the write operation is described with reference to FIG. 26. The example in FIG. 26 shows the case where the write operation is suspended in the first program loop, and resumed after the execution of a read operation, as in FIG. 15 according to the first embodiment. The example in FIG. 26 also shows the case where verify operations at the "A" to "C" levels are performed in one program loop, and the verify operation at the "A" is selected in the verify operation immediately before suspension.

As shown in FIG. 26, when receiving the suspend command "A7h", for example, during the program (during the application of the voltage VPGM to the selected word line WL), the sequencer 10 suspends the write operation after the end of the verify operation at the "A" level, and returns the ready/busy signal R/Bn to the "H" level. Therefore, the period tSTOPRST in the present embodiment is longer than the period tSTOPRST in the first embodiment by the execution of the verify operation at the "A" level.

After the resumption, the sequencer 10 resumes the write operation from the verify operation, and comes into the busy state after confirming the status at the time of the suspension of the write operation, as in the second embodiment. For example, even if the verify operations at the "A" to "C" levels are performed after resumption, the verify result before suspension is preferentially used regarding the determination of the verify operation at the "A" level. In the example in FIG. 26, the voltage of the program pulse is stepped up to VPGM+ΔV in the second program loop. However, as in the third embodiment, the program pulse does may not be stepped up in the initial program after resumption.

4.3 Advantageous Effects According to the Present Embodiment

In the configuration according to the present embodiment, when the write operation is suspended, the partial operation of the verify operation is selectively performed before suspension, and the verify operation can be again performed immediately after resumption. The condition subject to data retention is verified before suspension, so that the influence of data retention can be suppressed. Consequently, overprogramming attributed to the program operation after resumption can be suppressed, and miswriting can be reduced. Therefore, the reliability of the semiconductor memory device can be improved.

Furthermore, the present embodiment can be applied to the first and third embodiments. Thus, advantageous effects similar to those in the first and third embodiments can be obtained.

5. Fifth Embodiment

Next, a semiconductor memory device according to a fifth embodiment is described. In the case described in the fifth embodiment, in a write operation, the second program condition is applied to each of the memory cell transistors MT only once. The operation of the controller 200 in the fifth embodiment is the same as that in the first embodiment. Only the differences between the present embodiment and the first to fourth embodiments are described below.

5.1 Write Operation

First, the write operation in the present embodiment is described with reference to FIG. 27. The example in FIG. 27 shows the case of writing from the "Er" level to the "A" level.

Figure 27:
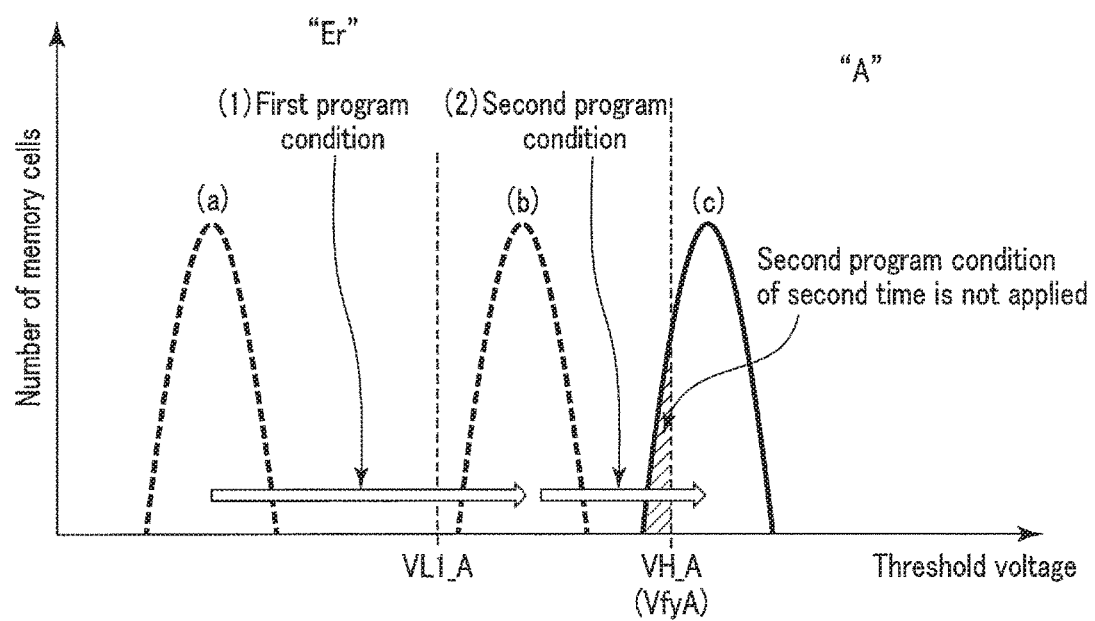
FIG. 27 is a threshold distribution diagram of a memory cell transistor during a write operation in a semiconductor memory device according to a fifth embodiment.

As shown in FIG. 27, first, the first program condition is applied to execute the program operation, and writing is performed from the threshold distribution (a) to the threshold distribution (b). The threshold distribution (b) is equal to or greater than the voltage VL1_A and is less than the voltage VH_A, so that in the next program operation, the second program condition is applied, and writing is performed from the threshold distribution (b) to the threshold distribution (c). Because the threshold voltage in the shaded portion of the threshold distribution (c) is lower than the voltage VH_A, the second verify operation is failed. However, the program operation under the second program condition has been already performed, and writing is therefore inhibited. That is, the second program operation under the second program condition is not performed for one memory cell transistor MT.

5.2 Overall Flow of Write Operation in NAND-Type Flash Memory

Figure 28:
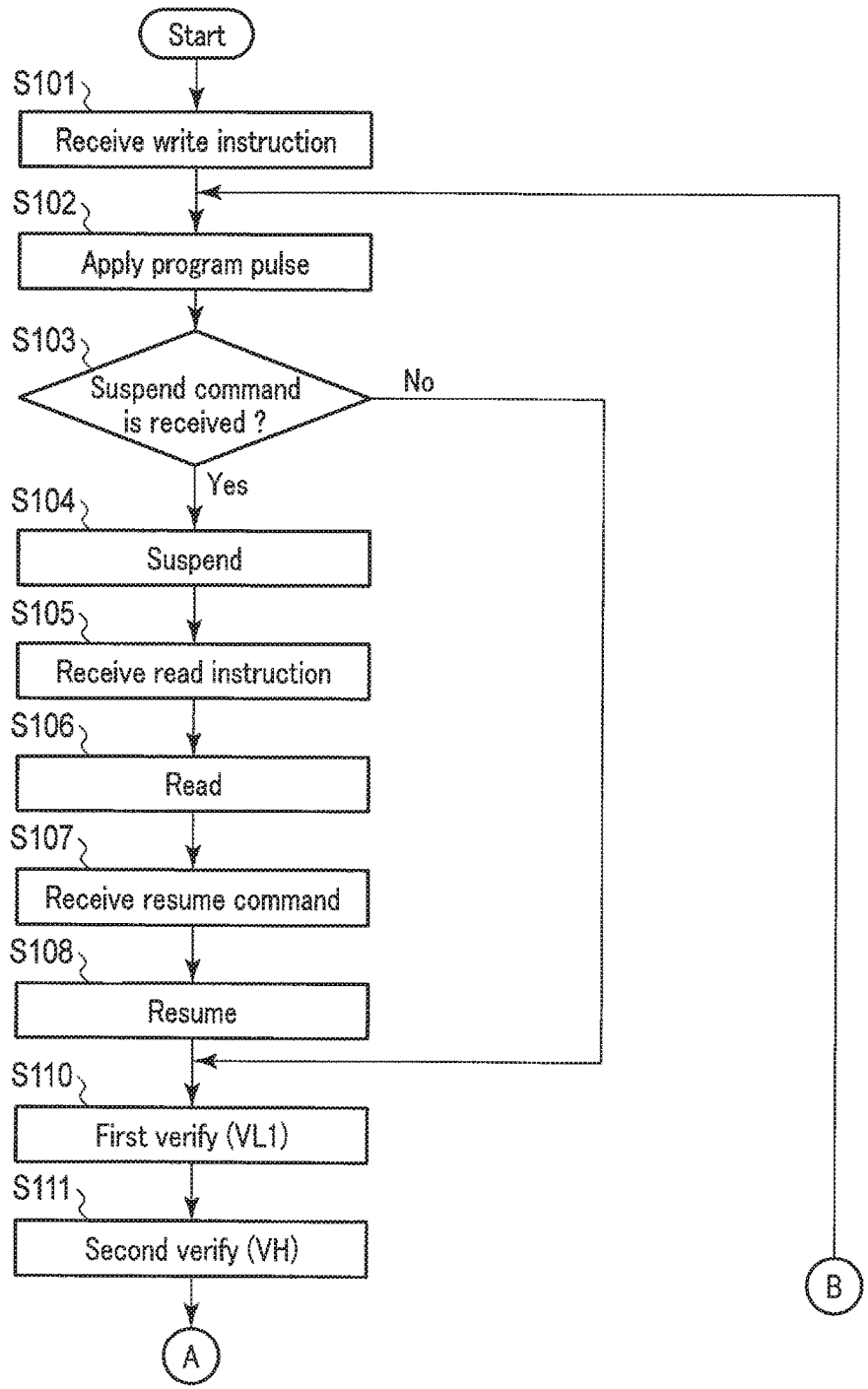
FIGS. 28 and 29 are flowcharts showing a write operation in the semiconductor memory device according to the fifth embodiment.
Figure 29:
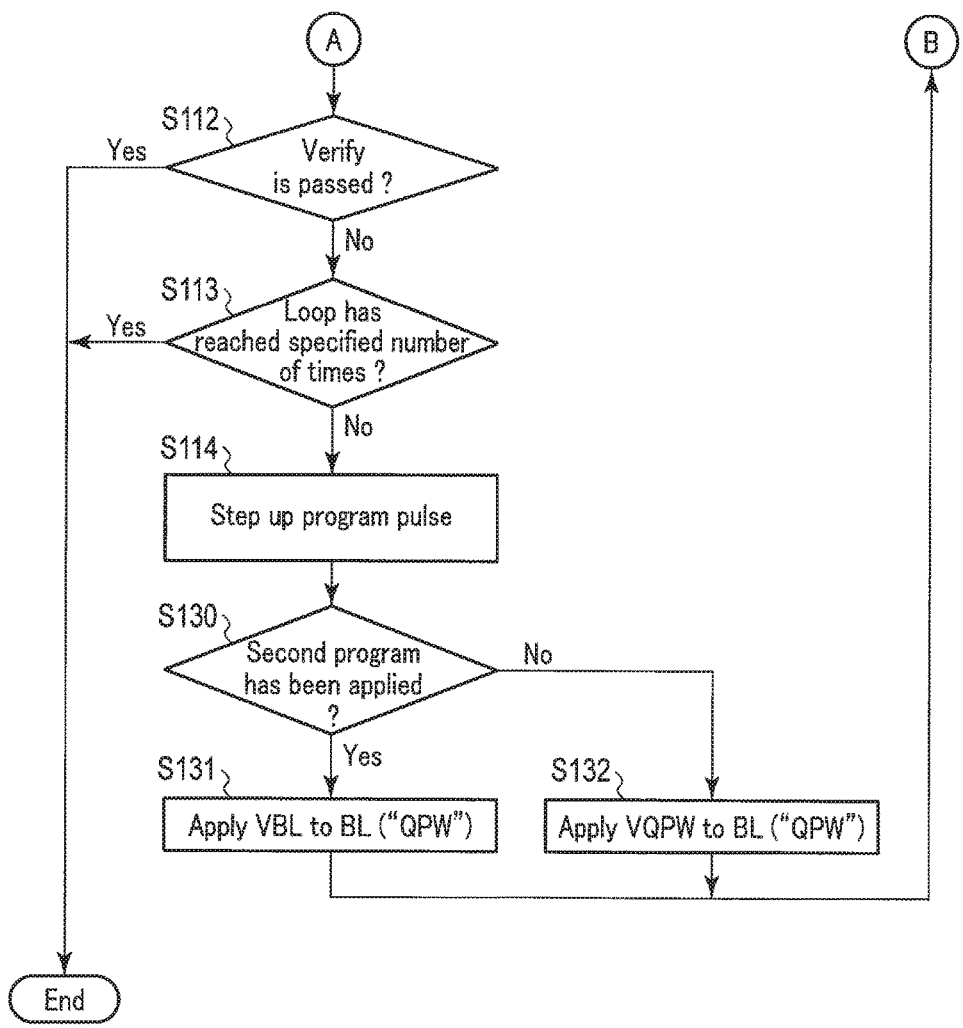

First, the overall flow of the write operation in the NAND-type flash memory 100 is described with reference to FIG. 28 and FIG. 29. The example shown in FIG. 28 and FIG. 29 shows the case where a write operation is suspended after the end of a program operation, and is resumed from the verify operation. The example shown in FIG. 28 and FIG. 29 shows the case where the first and second verify operations are performed for one level (e.g. the "A" level) for the simplification of explanation, as in FIG. 10 and FIG. 11 according to the first embodiment. The example in FIG. 28 and FIG. 29 also shows the case where the target level of the first verify operation immediately after resumption is at the same voltage VL1 as the target level of the first verify operation in the normal state, as in the second to fourth embodiments. Steps S101 to S108 and S110 to S114 in FIG. 28 and FIG. 29 are the same as those in FIG. 10 and FIG. 11 according to the first embodiment. Thus, the operations in steps S101 to S108 and S110 to S114 are not described in detail.

As shown in FIG. 28, the flow from step S101 to step S108 is the same as that in FIG. 10 according to the first embodiment.

After the resumption (step S108), or when the sequencer 10 has not received the suspend command (step S103_No), the sequencer 10 performs the first verify operation (step S110) and the second verify operation (step S111).

As shown in FIG. 29, when all the memory cell transistors MT (or a preset specified number of memory cell transistors MT or more) of the program target have passed the second verify operation (step S112_Yes), the sequencer 10 ends the write operation.

When there are memory cell transistors MT which have not passed the second verify operation (or there are memory cell transistors MT equal to or greater than the preset specified number) (step S112_No), the sequencer 10 confirms whether or not the program loop has reached a preset specified number of times (step S113).

When the program loop has reached the preset specified number of times (step S113_Yes), the sequencer 10 ends the write operation, and notifies the controller 200 of the fact that the write operation has not ended normally.

When the program loop has not reached the preset specified number of times (step S113_No), the sequencer 10 steps up the set voltage of the program pulse of the next program operation (step S114).

In the next program operation, the sense amplifier 15 applies the voltage VBL to the bit line BL("QPW") corresponding to the memory cell transistor MT to which the second program condition has been already applied (step S130_Yes) in the program operation executed before (step S131). The sense amplifier 15 also applies the voltage VQPW to the bit line BL("QPW") corresponding to the memory cell transistor MT to which the second program condition has not been applied (step S130_No) in the program operation executed before. Also, the sense amplifier 15 applies the voltage VSS to the bit line BL("0"), and applies the voltage VBL to the bit line BL("1"). Returning to step S102, the row decoder 14 applies a stepped-up program pulse to the selected word line WL.

The sequencer 10 repeats the program loop until the second verify operation is passed or until the program loop reaches the specified number of times.

5.3 Advantageous Effects According to the Present Embodiment

For example, when the threshold voltage of the memory cell transistor MT which has been equal to or greater than the voltage VH decreases to less than the voltage VH due to data retention attributed to suspension, the program operation under the second program condition is performed in the program operation after resumption. The program operation under the second program condition is actually performed for the memory cell transistor MT which has completed writing, which may lead to over-programming and miswriting.

In contrast, in the configuration according to the present embodiment, the second program condition can be applied one time in the write operation to each of the memory cell transistors MT. Thus, for the memory cell transistor MT whose threshold voltage has become equal to or greater than the voltage VH (which has passed the second verify operation), the program operation under the second program condition is not additionally executed even if the threshold voltage decreases to less than the voltage VH due to data retention. Consequently, over-programming can be suppressed, and miswriting can be reduced. Therefore, the reliability of the semiconductor memory device can be improved.

Furthermore, the present embodiment can be applied to the first to fourth embodiments. Thus, advantageous effects similar to those in the first to fourth embodiments can be obtained.

6. Modification Examples, Etc.

The semiconductor memory device according to each of the embodiments described above includes memory cell (MT), a bit line (BL) coupled to the memory cell, a sense amplifier (15) coupled to the bit line, a word line (WL) coupled to a gate of the memory cell, and a row decoder (14) coupled to the word line. A write operation repeats a program loop including a program operation, a first verify operation performed after the program operation, and a second verify operation performed after the first verify operation. The row decoder applies a first read voltage to the word line in the first and second verify operations. When the write operation is not suspended, the sense amplifier senses a voltage of the bit line for a first sense period (Ts_L1) in the first verify operation. When the write operation is suspended, the sense amplifier senses the voltage of the bit line for a second sense period (Ts_L2) shorter than the first sense period in the initial first verify operation after a resumption of the write operation. The sense amplifier senses the voltage of the bit line for a third sense period (Ts_H) longer than the first sense period in the second verify operation.

It is possible to provide a semiconductor memory device which can be increased in reliability by the application of the embodiments described above.

It is to be noted that the embodiments are not limited to the forms described above, and various modifications thereof can be made.

6.1 First Modification

For example, in the first embodiment, the first and second sense periods may have the same length, and the voltage VCGRV applied to the selected word line may be changed depending on the target levels of the verify operations. One example is described with reference to FIG. 30 and FIG. 31. Only the differences between FIG. 30 and FIG. 13 and FIG. 16 according to the first embodiment are described below.

As shown in FIG. 30, the first sense period (between the times t5 to t6) and the second sense period (between the times t10 to t11) have the same length. In the normal state, a voltage VCGRV1 is applied to the selected word line WL for a period of the times t1 to t8 in accordance with the first verify operation. On the other hand, immediately after resumption, a voltage VCGRV2 is applied to the selected word line WL for a period of the times t1 to t8 in accordance with the first verify operation. Also, a voltage VCGRV3 is applied to the selected word line WL for a period of the times t8 to t13 in accordance with the second verify operation. In this instance, the voltages VCGRV1, VCGRV2, and VCGRV3 are respectively set in accordance with the voltages VL1, VL2, and VH which are target levels, and have a relationship of VCGRV2<VCGRV1<VCGRV3.

Next, a specific example of the verify period immediately after resumption and the normal verify period are described with reference to FIG. 31. The example in FIG. 31 is a timing chart showing each of the voltages of the selected word line WL, the signal STB, and the signal XXL in the case of where the present example is applied to FIG. 15 according to the first embodiment.

As shown in FIG. 31, in the verify periods TA1, TB1, and TC1 immediately after resumption and the normal verify periods TA2, TB2, and TC2, the Ts (=Ts_L1=Ts_L2=Ts_H) is set as the first and second sense periods. In the normal verify periods TA2, TB2, and TC2, the voltages VCGRV1_A, VCGRV1_B, and VCGRV1_C are respectively set as the read voltages in accordance with the voltage VL1 which is the target level of the first verify operation. In the verify periods TA1, TB1, and TC1 immediately after resumption, the voltages VCGRV2_A, VCGRV2_B, and VCGRV2_C are respectively set as the read voltages in accordance with the voltage VL2 which is the target level of the first verify operation immediately after resumption. In the verify periods TA1, TB1, TC1, TA2, TB2, and TC2, the voltages VCGRV3_A, VCGRV3_B, and VCGRV3_C are respectively set as the read voltages in accordance with the voltage VH which is the target level of the second verify operation.

If the verify periods at the "A" to "C" levels are compared to one another, the verify period TA1 immediately after resumption and the normal verify period TA2 have the same length. The verify period TB1 immediately after resumption and the normal verify period TB2 have the same length. The verify period TC1 immediately after resumption and the normal verify period TC2 have the same length. That is, in the verify periods TA1 and TA2, the voltage VCGRV2_A application period to the selected word line and the voltage VCGRV1_A application period to the selected word line have the same length. In the verify periods TB1 and TB2, the voltage VCGRV2_B application period to the selected word line and the voltage VCGRV1_B application period to the selected word line have the same length. In the verify periods TC1 and TC2, the voltage VCGRV2_C application period to the selected word line and the voltage VCGRV1_C application period to the selected word line have the same length.

Although the read voltages (VCGRV2_A, VCGRV2_B, and VCGRV2_C) in accordance with the voltage VL2 are respectively set in all of the first verify operations at the "A" to "C" levels performed immediately after resumption in the case described in the present example, the read voltage in accordance with the voltage VL2 may be set for at least one of the "A" to "C" levels, and the read voltage (VCGRV1_A, VCGRV1_B, or VCGRV1_C) in accordance with the voltage VL1 may be set for the other levels. In addition, the lengths of the verify periods TA1, TB1, and TC1 (that is, TA2, TB2, and TC2) may be different length from one another. Moreover, although the verify operations of all the "A" to "C" levels are performed immediately after resumption in the case described, the verify operation of at least one of the "A" to "C" levels may be performed depending on the situation of data writing into the memory cell transistor MT.

In such a configuration as well, advantageous effects similar to those in the first embodiment can be obtained.

6.2 Other Modifications

For example, the embodiments described above can be combined to any possible extent. For example, the fourth and fifth embodiments may be applied to the first embodiment.

Furthermore, the embodiments described above are not limited to the three-dimensionally stacked NAND-type flash memory, and are also applicable to a planar NAND-type flash memory in which memory cells are arranged on a semiconductor substrate. Moreover, the embodiments described above are not limited to the NAND-type flash memory, and are also applicable to other semiconductor memory devices using memories which enable suspension and resumption to be performed during a write operation including a program operation and a verify operation.

Furthermore, the terms "connect" and "couple" in the embodiments described above not only include direct coupling but also include indirect coupling with the intervention of some element such as a transistor or a resistor, etc.

Furthermore, in the embodiments described above, when the voltages are the same, the values of the voltages do not need to be strictly identical, and a numerical difference is permitted as a tolerance within the range in which the advantageous effects according to the embodiments described above can be obtained.

In each of the embodiments according to the present invention, the following may be applied; for example, the memory cell transistor MT is capable of holding 2-bit (4-value) data, and the threshold levels at which the 4 values are held are the "Er" level (erase level), the "A" level, the "B" level, and the "C" level in ascending order, in which case:

(1) In the read operation, the voltage applied to the word line selected for the read operation at the A level is, for example, 0 V to 0.55 V. The voltage is not limited thereto, and may be 0.1 V to 0.24 V, 0.21 V to 0.31 V, 0.31 V to 0.4 V, 0.4 V to 0.5 V, or 0.5 V to 0.55 V.

The voltage applied to the word line selected for the read operation at the B level is, for example, 1.5 V to 2.3 V. The voltage is not limited thereto, and may be 1.65 V to 1.8 V, 1.8 V to 1.95 V, 1.95 V to 2.1 V, or 2.1 V to 2.3 V.

The voltage applied to the word line selected for the read operation at the C level is, for example, 3.0 V to 4.0 V. The voltage is not limited thereto, and may be 3.0 V to 3.2 V, 3.2 V to 3.4 V, 3.4 V to 3.5 V, 3.5 V to 3.6 V, or 3.6 V to 4.0 V.

The time (tR) for the read operation may be, for example, 25 μs V to 38 μs, 38 μs to 70 μs, or 70 μs to 80 μs.

(2) The write operation includes the program operation and the verify operation as described above. In the write operation, the voltage first applied to the selected word line at the time of the program operation is, for example, 13.7 V to 14.3 V. The voltage is not limited thereto, and may be, for example, 13.7 V to 14.0 V, or 14.0 V to 14.6 V.

The voltage first applied to the selected word line at the time of writing in the odd word lines, and the voltage first applied to the selected word line at the time of writing in the even word lines may be changed.

When the program operation is in the form of an incremental step pulse program (ISPP), a step-up voltage is, for example, about 0.5 V.

The voltage applied to unselected word lines may be, for example, 6.0 V to 7.3 V. The voltage is not limited thereto, and may be, for example, 7.3 V to 8.4 V, or may be 6.0 V or less.

A path voltage to be applied may be changed depending on whether the unselected word lines are odd word lines or even word lines.

The time (tProg) of the write operation may be, for example, 1700 μs V to 1800 s, 1800 μs to 1900 μs, or 1900 μs to 2000 μs.

(3) In the erase operation, the voltage first applied to a well that is formed on the top of a semiconductor substrate and above which memory cells are arranged is, for example, 12 V to 13.6 V. The voltage is not limited thereto, and may be, for example, 13.6 V to 14.8 V, 14.8 V to 19.0 V, 19.0 V to 19.8 V, or 19.8 V to 21 V.

The time (tErase) of the erase operation may be, for example, 3000 μs to 4000 μs, 4000 μs to 5000 μs, or 4000 μs to 9000 μs.

(4) The structure of the memory cell has a charge storage layer disposed on a semiconductor substrate (silicon substrate) via a tunnel insulating film having a thickness of 4 to 10 nm. This charge storage layer can have a stacked layer structure of an insulating film of, for example, SiN or SiON having a thickness of 2 to 3 nm and polysilicon having a thickness of 3 to 8 nm. A metal such as Ru may be added to polysilicon. An insulating film is provided on the charge storage layer. This insulating film has, for example, a silicon oxide film having a thickness of 4 to 10 nm which intervenes between a lower high-k film having a thickness of 3 to 10 nm and an upper high-k film having a thickness of 3 to 10 nm. The high-k films include, for example, HfO. Also, the thickness of the silicon oxide film can be greater than the thickness of the high-k films. A control electrode having a thickness of 30 to 70 nm is formed on the insulating film via a material for work function adjustment having a thickness of 3 to 10 nm. Here, the material for work function adjustment is a metal oxide film such as TaO or a metal nitride film such as TaN. W, for example, can be used for the control electrode.

In addition, an air gap can be formed between the memory cells.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a memory cell;
a bit line coupled to the memory cell;
a sense amplifier coupled to the bit line;
a word line coupled to a gate of the memory cell; and
a row decoder coupled to the word line,
wherein a write operation repeats a program loop including a program operation, a first verify operation performed after the program operation, and a second verify operation performed after the first verify operation,
the row decoder applies a first read voltage to the word line in the first and second verify operations,
when the write operation is not suspended, the sense amplifier senses a voltage of the bit line for a first sense period in the first verify operation,
when the write operation is suspended, the sense amplifier senses the voltage of the bit line for a second sense period shorter than the first sense period in the initial first verify operation after a resumption of the write operation, and
the sense amplifier senses the voltage of the bit line for a third sense period longer than the first sense period in the second verify operation.

2. The device according to claim 1, wherein the write operation is suspended before the first verify operation is performed after the program operation, and is resumed from the first verify operation.

3. The device according to claim 1, wherein the write operation is suspended before the program operation in the next program loop is executed after the second verify operation, and is resumed from the first verify operation.

4. The device according to claim 1, wherein the write operation is suspended before the end of the second verify operation after at least a part of the first verify operation or the second verify operation is performed, and is resumed from the first verify operation.

5. The device according to claim 1, wherein in the write operation, the write operation is suspended when a suspend command to suspend the write operation is received, and the write operation is resumed when a resume command to resume the write operation is received.

6. The device according to claim 1, wherein the program operation includes a first program condition to apply a first voltage to the bit line when the first verify operation is failed, and a second program condition to apply a second voltage higher than the first voltage to the bit line when the first verify operation is passed and the second verify operation is failed.

7. The device according to claim 1, wherein the row decoder applies a program voltage to the word line in the program operation, and
the program voltage is stepped up every time the program loop is repeated.

8. The device according to claim 1, wherein the row decoder applies a program voltage to the word line in the program operation,
when the write operation is not suspended, the program voltage is stepped up every time the program loop is repeated, and
when the write operation is suspended, the first program voltage after the resumption of the write operation is the same as the last program voltage before the write operation is suspended.

9. The device according to claim 6, wherein in the write operation, the second program condition is applied only once for the memory cell.

10. The device according to claim 6, wherein the program loop further includes a third verify operation performed after the second verify operation, and a fourth verify operation performed after the third verify operation,
the row decoder applies a second read voltage higher than the first read voltage to the word line when the third and fourth verify operations are performed,
the first program condition is applied when the first verify operation or the third verify operation is failed,
the second program condition is applied when the first verify operation is passed and the second verify operation is failed or when the third verify operation is passed and the fourth verify operation is failed,
when the write operation is not suspended, the sense amplifier senses the voltage of the bit line for a fourth sense period in the third verify operation,
when the write operation is suspended, the sense amplifier senses the voltage of the bit line for a fifth sense period shorter than the fourth sense period in the initial third verify operation after the resumption of the write operation, and
the sense amplifier senses the voltage of the bit line for a sixth sense period longer than the fourth sense period in the fourth verify operation.

* * * * *